US010622580B2

(12) United States Patent
Tsuchiya et al.

(10) Patent No.: US 10,622,580 B2
(45) Date of Patent: Apr. 14, 2020

(54) LIGHT-EMITTING DEVICE

(71) Applicant: Semiconductor Energy Laboratory Co., Ltd., Atsugi-shi, Kanagawa-ken (JP)

(72) Inventors: Kaoru Tsuchiya, Atsugi (JP); Ayumi Sato, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/227,170

(22) Filed: Dec. 20, 2018

(65) Prior Publication Data
US 2019/0123295 A1 Apr. 25, 2019

Related U.S. Application Data

(60) Continuation of application No. 14/529,695, filed on Oct. 31, 2014, which is a continuation of application
(Continued)

(30) Foreign Application Priority Data

Sep. 17, 2004 (JP) .................................. 2004-272644

(51) Int. Cl.
*H01L 51/50* (2006.01)
*H01L 51/52* (2006.01)
(Continued)

(52) U.S. Cl.
CPC ...... *H01L 51/5237* (2013.01); *H01L 27/3251* (2013.01); *H01L 27/3276* (2013.01);
(Continued)

(58) Field of Classification Search
CPC ............. H01L 51/5237; H01L 27/3251; H01L 27/3276; H01L 29/78654; H01L 29/78675;
(Continued)

(56) References Cited

U.S. PATENT DOCUMENTS 5,882,761 A 3/1999 Kawami et al.
6,111,357 A 8/2000 Fleming et al.
(Continued)

FOREIGN PATENT DOCUMENTS

CN 001338712 A 3/2002
CN 001458640 A 11/2003
(Continued)

OTHER PUBLICATIONS

Office Action (Application No. 200510124901.2) dated Oct. 10, 2008.

*Primary Examiner* — Anh T Mai
*Assistant Examiner* — Fatima N Farokhrooz
(74) *Attorney, Agent, or Firm* — Robinson Intellectual Property Law Office; Eric J. Robinson

(57) ABSTRACT

It is an object of the present invention to provide a light-emitting device where periphery deterioration can be prevented from occurring even when an organic insulating film is used as an insulating film for the light-emitting device. In addition, it is an object of the present invention to provide a light-emitting device where reliability for a long period of time can be improved. A structure of an inorganic film, an organic film, and an inorganic film is not continuously provided from under a sealing material under a cathode for a light-emitting element. In addition, penetration of water is suppressed by defining the shape of the inorganic film that is formed over the organic film even when a structure of an inorganic film, an organic film, and an inorganic film is continuously provided under a cathode for a light-emitting element.

16 Claims, 17 Drawing Sheets

Related U.S. Application Data

No. 12/817,663, filed on Jun. 17, 2010, now Pat. No. 9,030,094, which is a division of application No. 11/227,211, filed on Sep. 16, 2005, now Pat. No. 7,791,270.

(51) Int. Cl.
  *H01L 27/32* (2006.01)
  *H01L 29/786* (2006.01)
  *H01L 51/56* (2006.01)

(52) U.S. Cl.
  CPC .. *H01L 29/78654* (2013.01); *H01L 29/78675* (2013.01); *H01L 51/5016* (2013.01); *H01L 51/524* (2013.01); *H01L 51/5246* (2013.01); *H01L 27/3246* (2013.01); *H01L 27/3258* (2013.01); *H01L 51/56* (2013.01)

(58) Field of Classification Search
  CPC .............. H01L 51/5016; H01L 51/524; H01L 51/5246; H01L 27/3246; H01L 27/3258; H01L 51/56
  USPC ............... 313/498–512; 428/690–691, 917; 438/26–29, 34, 82; 427/66, 532–535, 427/539; 315/169.1, 169.3
  See application file for complete search history.

(56) References Cited

U.S. PATENT DOCUMENTS

| | | | |
|---|---|---|---|
| 6,124,604 | A | 9/2000 | Koyama et al. |
| 6,518,557 | B1 | 2/2003 | Lzumiy et al. |
| 6,531,815 | B1 | 3/2003 | Okuyama et al. |
| 6,717,181 | B2 | 4/2004 | Murakami et al. |
| 6,781,109 | B2 | 8/2004 | Lzumiy et al. |
| 6,781,162 | B2 | 8/2004 | Yamazaki et al. |
| 6,788,278 | B2 | 9/2004 | Aoki |
| 6,798,132 | B2 | 9/2004 | Satake |
| 6,844,672 | B2 | 1/2005 | Yamazaki |
| 6,900,590 | B2 | 5/2005 | Ooishi et al. |
| 6,936,846 | B2 | 8/2005 | Koyama et al. |
| 6,992,332 | B2 | 1/2006 | Yamazaki et al. |
| 7,019,718 | B2 * | 3/2006 | Yamazaki ............ G02F 1/1339 345/76 |
| 7,027,043 | B2 | 4/2006 | Sakaki |
| 7,094,684 | B2 | 8/2006 | Yamazaki et al. |
| 7,106,279 | B2 | 9/2006 | Hirayama |
| 7,109,655 | B2 | 9/2006 | Kurihara |
| 7,142,781 | B2 | 11/2006 | Koyama et al. |
| 7,169,461 | B2 | 1/2007 | Hiruma et al. |
| 7,282,736 | B2 | 10/2007 | Murakami et al. |
| 7,397,179 | B2 | 7/2008 | Kim |
| 7,408,191 | B2 | 8/2008 | Murakami et al. |
| 7,531,847 | B2 | 5/2009 | Shitagaki et al. |
| 7,585,761 | B2 | 9/2009 | Yamazaki et al. |
| 7,671,369 | B2 | 3/2010 | Yamazaki et al. |
| 7,723,179 | B2 | 5/2010 | Yamazaki et al. |
| RE42,308 | E | 4/2011 | Hirayama |
| 8,008,666 | B2 | 8/2011 | Yamazaki et al. |
| 8,022,404 | B2 | 9/2011 | Murakami et al. |
| RE44,086 | E | 3/2013 | Hirayama |
| 8,450,741 | B2 | 5/2013 | Murakami et al. |
| 8,803,152 | B2 | 8/2014 | Murakami et al. |
| 2002/0011975 | A1 * | 1/2002 | Yamazaki ............ G02F 1/1339 345/76 |
| 2002/0024096 | A1 * | 2/2002 | Yamazaki ............ H01L 51/524 257/359 |
| 2002/0113248 | A1 | 8/2002 | Yamagata et al. |
| 2002/0158568 | A1 * | 10/2002 | Satake .................. H01L 27/322 313/493 |
| 2002/1016361 | | 11/2002 | Kamijima et al. |
| 2002/0190256 | A1 | 12/2002 | Murakami et al. |
| 2003/0015961 | A1 | 1/2003 | Yamazaki |
| 2003/0094615 | A1 | 5/2003 | Yamazaki et al. |
| 2003/0103184 | A1 | 6/2003 | Nishino |
| 2003/0137325 | A1 | 7/2003 | Yamazaki et al. |
| 2003/0155573 | A1 * | 8/2003 | Yamazaki ............... H01L 27/12 257/72 |
| 2003/0184217 | A1 | 10/2003 | Yamazaki et al. |
| 2003/0194484 | A1 | 10/2003 | Yamazaki et al. |
| 2003/0201447 | A1 * | 10/2003 | Yamazaki ........... H01L 27/3246 257/79 |
| 2003/0222575 | A1 * | 12/2003 | Yamazaki ........... H01L 27/3246 313/504 |
| 2004/0072380 | A1 | 4/2004 | Yamazaki et al. |
| 2004/0157564 | A1 | 8/2004 | Murakami et al. |
| 2005/0023969 | A1 | 2/2005 | Omata et al. |
| 2005/0067953 | A1 | 3/2005 | Yamazaki et al. |
| 2007/0036955 | A1 | 2/2007 | Hiruma et al. |
| 2011/0309364 | A1 | 12/2011 | Yamazaki et al. |

FOREIGN PATENT DOCUMENTS

| | | |
|---|---|---|
| EP | 0776147 A | 5/1997 |
| EP | 0971564 A | 1/2000 |
| EP | 1148553 A | 10/2001 |
| EP | 1176457 A | 1/2002 |
| EP | 2275860 A | 1/2011 |
| JP | 60-131998 | 9/1985 |
| JP | 07-169567 A | 7/1995 |
| JP | 09-148066 A | 6/1997 |
| JP | 09-197415 A | 7/1997 |
| JP | 10-253990 A | 9/1998 |
| JP | 2000-036381 A | 2/2000 |
| JP | 2000-068050 A | 3/2000 |
| JP | 2000-269475 A | 9/2000 |
| JP | 2001-217073 A | 8/2001 |
| JP | 2002-006777 A | 1/2002 |
| JP | 2002-110343 A | 4/2002 |
| JP | 2002-198186 A | 7/2002 |
| JP | 2002-359085 A | 12/2002 |
| JP | 2003-036974 A | 2/2003 |
| JP | 2003-045671 A | 2/2003 |
| JP | 2003-280543 A | 10/2003 |
| JP | 2003-302917 A | 10/2003 |
| JP | 2004-004492 A | 1/2004 |
| JP | 2004-029262 A | 1/2004 |
| JP | 2004-047446 A | 2/2004 |
| JP | 2004-062164 A | 2/2004 |
| JP | 2004-134788 A | 4/2004 |
| JP | 2004-152542 A | 5/2004 |
| JP | 2004-158442 A | 6/2004 |
| JP | 2004-206056 A | 7/2004 |
| KR | 2002-0009498 A | 2/2002 |
| KR | 2003-0089447 A | 11/2003 |
| TW | 519606 | 2/2003 |
| TW | 200401455 | 1/2004 |
| WO | WO-2004/057920 | 7/2004 |

* cited by examiner

FIG. 2A
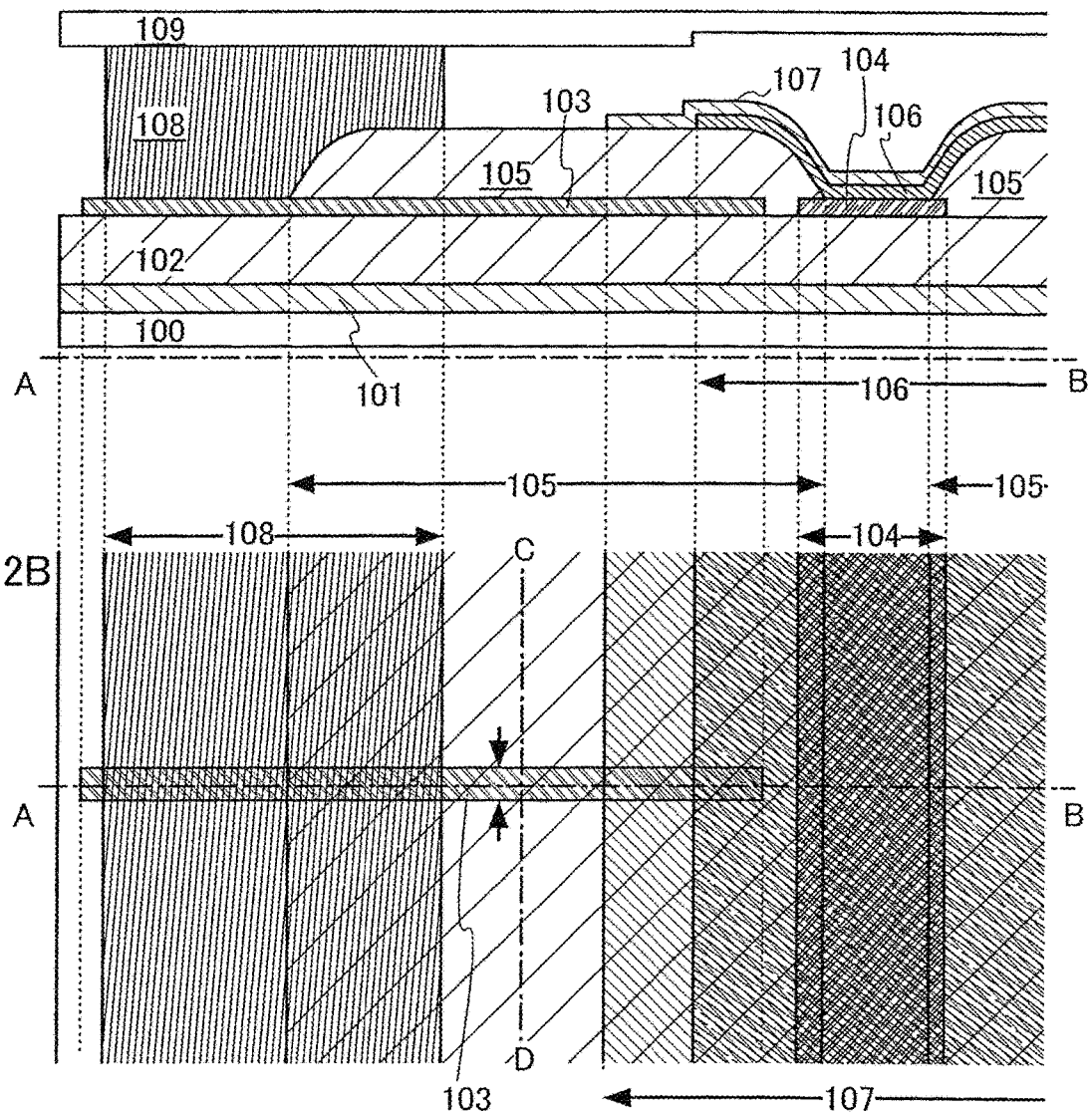
FIG. 2B
FIG. 2C
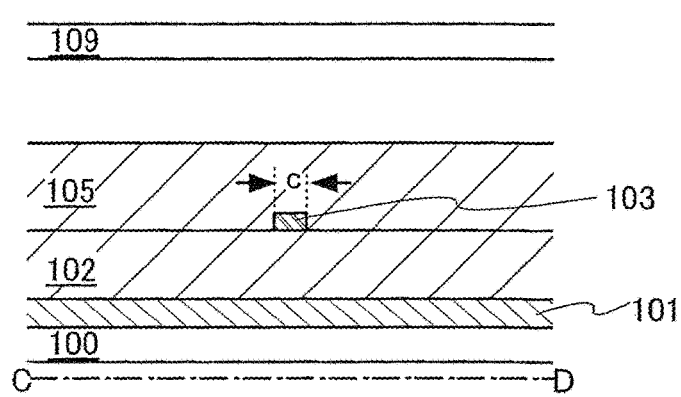

FIG. 3A
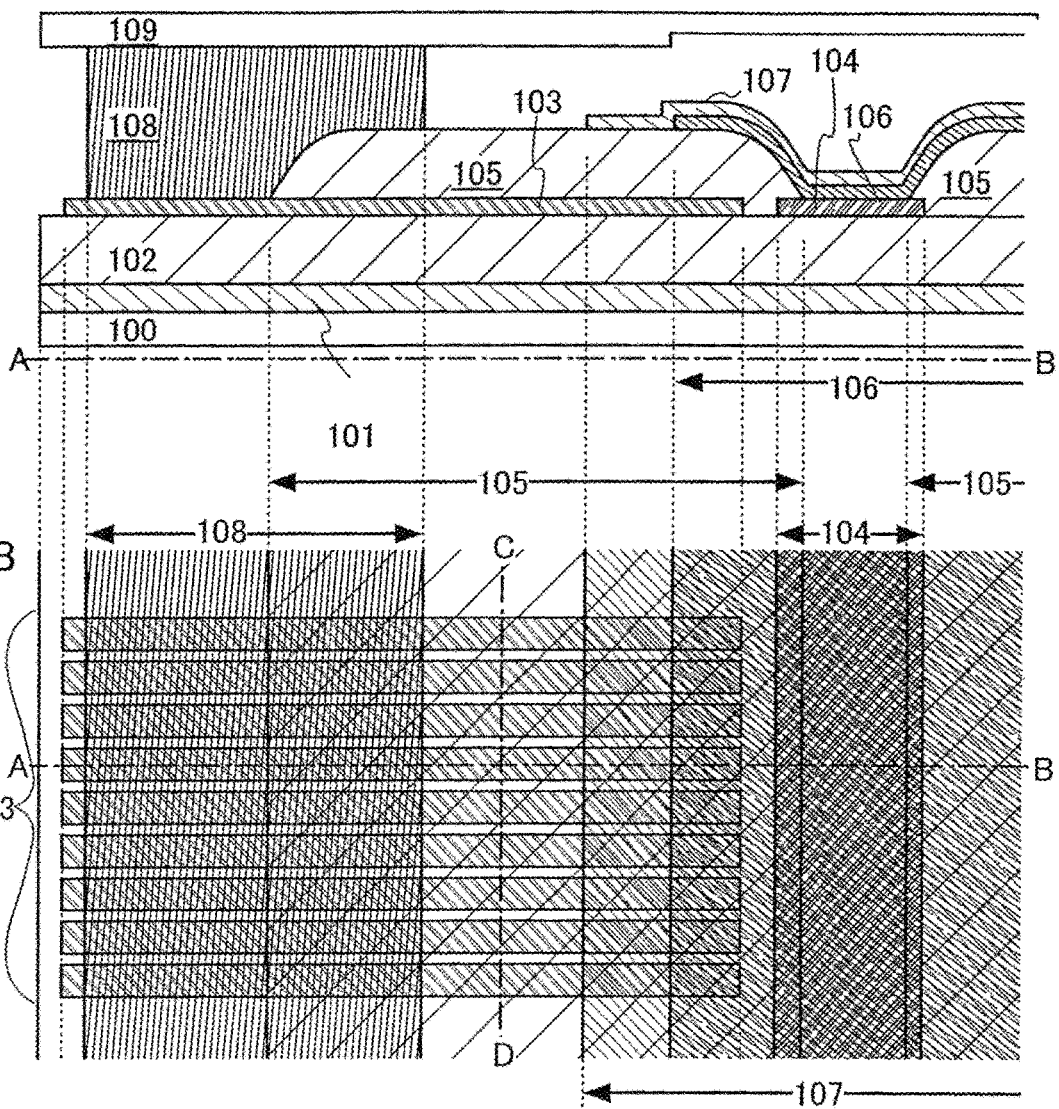
FIG. 3B
FIG. 3C
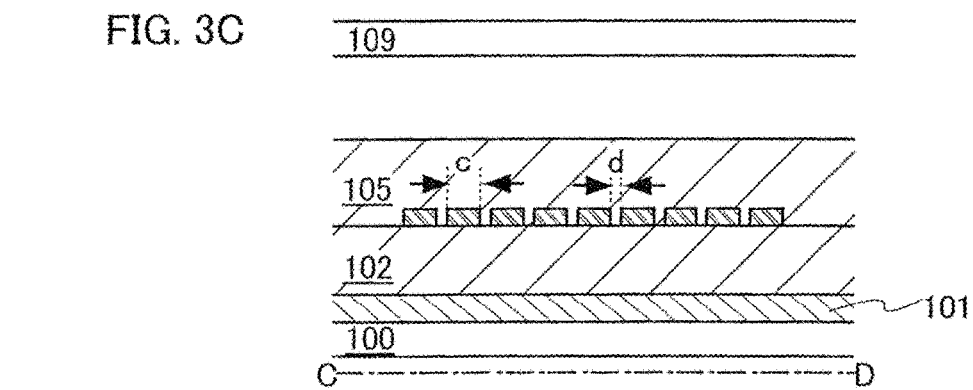

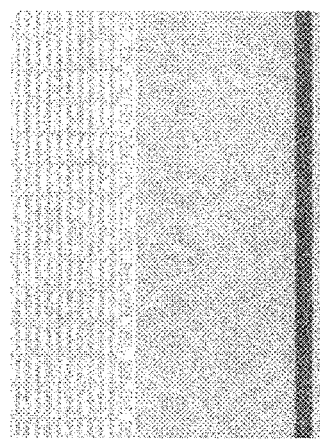
FIG. 13D  Gap between wirings: 0 μm
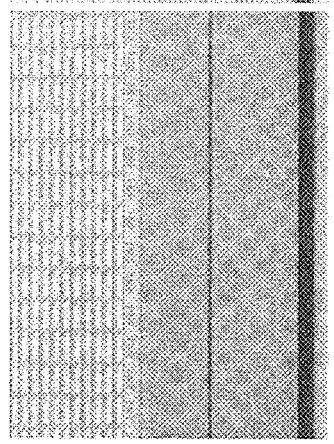
FIG. 13C  Gap between wirings: 20 μm
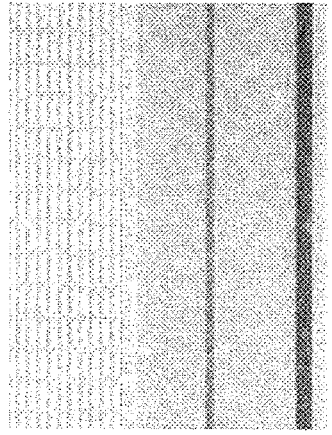
FIG. 13B  Gap between wirings: 50 μm
FIG. 13A  Gap between wirings: 200 μm

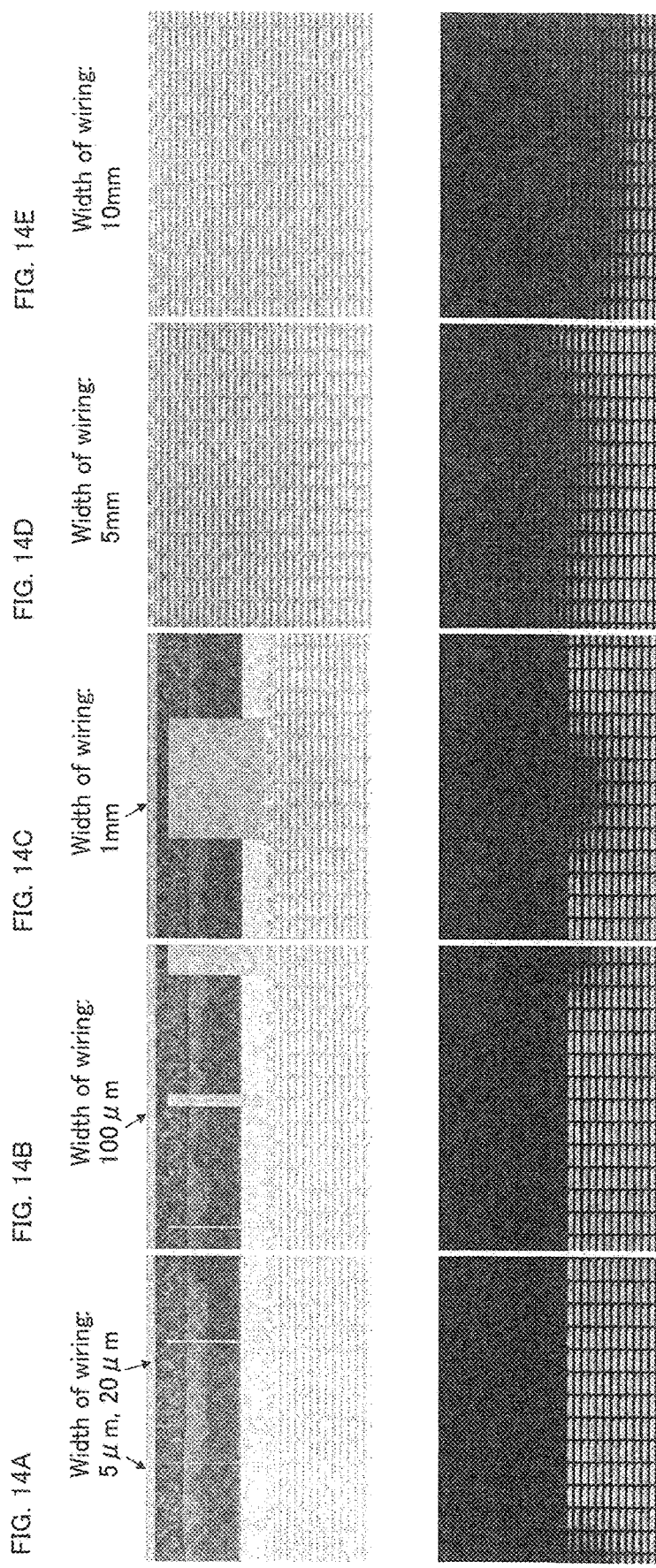

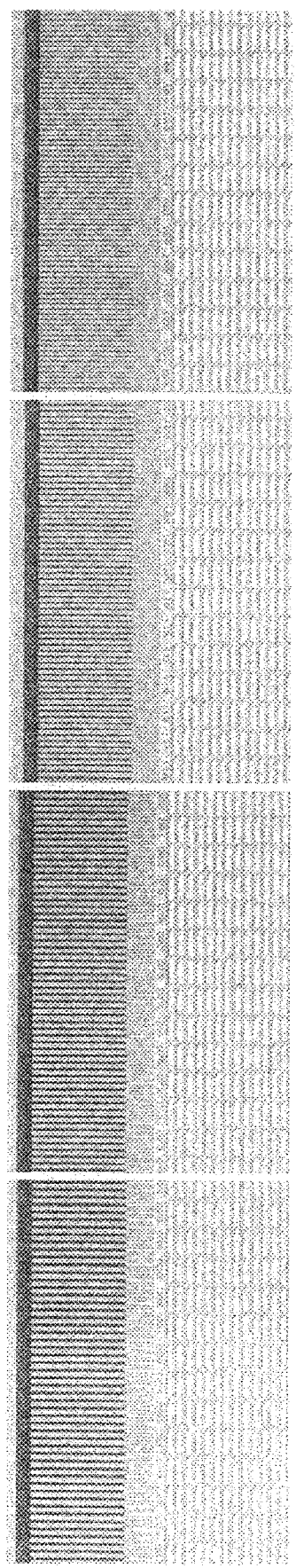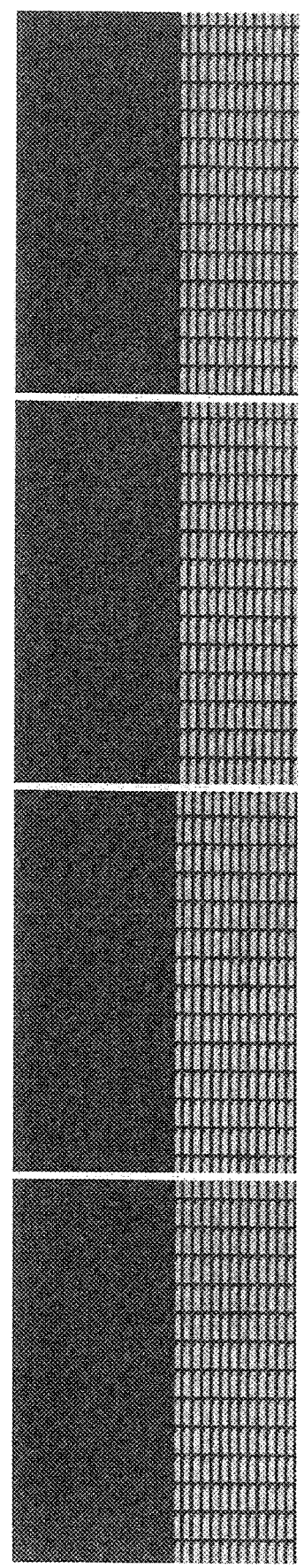
FIG. 15A  Gap between wirings: 20 μm
FIG. 15B  Gap between wirings: 15 μm
FIG. 15C  Gap between wirings: 10 μm
FIG. 15D  Gap between wirings: 5 μm

LIGHT-EMITTING DEVICE

BACKGROUND OF THE INVENTION

1. Field of the Invention

The present invention relates to a light-emitting device manufactured by using an element (light-emitting element) that emits light by applying a current between electrodes with a luminescent material therebetween, and more particularly, relates to a sealing structure in the light-emitting device.

2. Description of the Related Art

In recent years, thin and light displays using light-emitting elements have been actively developed. In order to manufacture a light-emitting element, a material that produces luminescence by applying a current is interposed between a pair of electrodes. Since the light-emitting element itself emits light unlike a liquid crystal, a light source such as a backlight is not necessary, and thus, the element itself is quite thin. Accordingly, the light-emitting element is quite advantageous when thin and light displays are manufactured.

However, one of the backgrounds to the fact that no practical application has been achieved in spite of having these great advantages is a problem of reliability. A light-emitting element using an organic material is often deteriorated due to moisture (water), and has the disadvantage that it is hard to obtain reliability for a long period of time. The light-emitting element deteriorated due to water causes decrease in luminance or emits no light any longer. This is considered to be a cause for a dark spot (black spot) or luminance degradation from the periphery of a light-emitting device (luminance degradation in which a light-emitting area gradually decreases from an edge portion of a display device, which is hereinafter referred to as "periphery deterioration") in a light-emitting device using a light-emitting element, and various measures has been proposed in order to suppress this deterioration (for example, refer Patent Documents 1 and 2).

However, even if these measures are applied, sufficient reliability has not been obtained yet, and further improvement in reliability has been desired.

In addition, for a light-emitting device, it is often the case that an organic insulating film that can be formed by coating is used as an insulating film. This organic insulating film has properties that are quite favorable in applying to a light-emitting device, such as superiority in flatness and capability to reduce unevenness of the underlying layer.

Patent Document 1

Japanese Patent Application Laid-Open No. 9-148066

Patent Document 2

Japanese Patent Application Laid-Open No. 7-169567

SUMMARY OF THE INVENTION

The organic insulating film has the properties, which are quite favorable when a light-emitting device is formed. However, in the case of a light-emitting device that has an interlayer insulating film formed with the use of an organic insulating film, periphery deterioration can be accelerated depending on the structure thereof.

Consequently, it is an object of the present invention to provide a light-emitting device where deterioration at the periphery can be prevented from occurring even when an organic insulating film is used as an insulating film for the light-emitting device. In addition, it is an object of the present invention to provide a light-emitting device where reliability for a long period of time can be improved.

One of structures of a light-emitting device according to the present invention for solving the problem includes a first substrate; a first insulating film comprising organic material, formed over the first substrate; a film comprising inorganic material formed on the first organic insulating film; a second insulating film covering an edge of the film comprising inorganic material, formed over the first insulating film; a light emitting element having at least one electrode, a portion of the electrode formed on the second insulating film; and a second substrate opposed to the first substrate with a sealing material interposed therebetween, wherein the sealing material is formed on a portion of the film comprising inorganic material, wherein the film comprising inorganic material is not overlapped with the electrode, and wherein there is a gap between the sealing material and the electrode.

One of the structures of the light-emitting device according to the present invention for solving the problem includes a first substrate; a first insulating film comprising organic material, formed over the first substrate; first and second films formed on the first organic insulating film, each of the first and second films comprising inorganic material; a second insulating film comprising organic material, covering the second film and comprising inorganic material and an edge of the first film comprising inorganic material, formed over the first insulating film; a light emitting element having at least one electrode, a portion of the electrode formed on the second insulating film; and a second substrate opposed to the first substrate with a sealing material interposed therebetween, wherein the sealing material is formed on a portion of the first film comprising inorganic material, wherein a portion of the second film comprising inorganic material is overlapped with the electrode, and wherein there are a gap between the first film comprising inorganic material and the second film comprising inorganic material and a gap between the sealing material and the electrode.

One of the structures of the light-emitting device according to the present invention for solving the problem includes a first substrate; a first insulating film comprising organic material, formed over the first substrate; at least first and second films formed on the first insulating film, each of the first and second films comprising inorganic material; a second insulating film comprising organic material, covering an edge of the first film comprising inorganic material and an edge of the second film comprising inorganic material, formed over the first insulating film; a light emitting element having at least one electrode, a portion of the electrode formed on the second insulating film; and a second substrate opposed to the first substrate with a sealing material interposed therebetween, wherein each of the first film comprising inorganic material and second film comprising inorganic material has a portion of less than 1 mm in width between an edge of the first substrate and the electrode, and wherein there is a gap between the sealing material and the electrode.

One of the structures of the light-emitting device according to the present invention for solving the problem includes a first substrate; a first insulating film comprising organic material, formed over the first substrate; at least first and second films formed on the first insulating film, each of the first and second films comprising inorganic material; a second insulating film comprising organic material, covering an edge of the first film comprising inorganic material and an edge of the second film comprising inorganic material, formed over the first insulating film; a light emitting element having at least one electrode, a portion of the electrode formed on the second insulating film; and a second substrate opposed to the first substrate with a sealing material interposed therebetween, wherein each of the first film comprising inorganic material and second inorganic film comprising inorganic material has a portion of less than 1 mm in width between an edge of the first substrate and the electrode, and wherein the sealing material is overlapped with the electrode and the overlap is 15 µm or less.

One of the structures of the light-emitting device according to the present invention for solving the problem includes a first substrate; a first insulating film comprising organic material, formed over the first substrate; at least first and second films adjacent to each other formed on the first insulating film, each of the first and second films comprising inorganic material; a second insulating film comprising organic material, covering an edge of the first film comprising inorganic material and an edge of the second film comprising inorganic material, formed over the first insulating film; a light emitting element having at least one electrode, a portion of the electrode formed on the second insulating film; and a second substrate opposed to the first substrate with a sealing material interposed therebetween, wherein each of the first and second films has a portion of less than 1 mm in width, wherein a distance between the first film comprising inorganic material and second film comprising inorganic material is 5 µm or more, and wherein there is a gap between the sealing material and the electrode.

One of the structures of the light-emitting device according to the present invention for solving the problem includes a first substrate; a first insulating film comprising organic material, formed over the first substrate; at least first and second films adjacent to each other formed on the first insulating film, each of the first and second films comprising inorganic material; a second insulating film comprising organic material, covering an edge of the first film comprising inorganic material and an edge of the second film comprising inorganic material, formed over the first insulating film; a light emitting element having at least one electrode, a portion of the electrode formed on the second insulating film; and a second substrate opposed to the first substrate with a sealing material interposed therebetween, wherein each of the first film comprising inorganic material and second film comprising inorganic material has a portion of less than 1 mm in width, wherein a distance between the first film comprising inorganic material and second film comprising inorganic material is 5 or more, and wherein the sealing material is overlapped with the electrode and the overlap is 15 µm or less.

One of the structures of the light-emitting device according to the present invention for solving the problem includes a first substrate; a first insulating film comprising organic material, formed over the first substrate; a film comprising inorganic material formed on the first insulating film; a second insulating film comprising organic material, covering an edge of the film comprising inorganic material, formed over the first insulating film; a light emitting element having at least one electrode, a portion of the electrode formed on the second insulating film; and a second substrate opposed to the first substrate with a sealing material interposed therebetween, wherein the film comprising inorganic material has at least first and second openings at least between an edge of the first substrate and the electrode, wherein the first and second openings are arranged adjacent to each other in a narrower-side direction of the first and second openings, wherein each width of the first and second opening is 5 µm or more in the shorter-side direction of the first and second openings, wherein a distance between the first and second openings is less than 1 mm, and wherein there is a gap between the sealing material and the electrode.

One of the structures of the light-emitting device according to the present invention for solving the problem includes a first substrate; a first insulating film comprising organic material, formed over the first substrate; a film comprising inorganic material formed on the first insulating film; a second insulating film comprising organic material, covering an edge of the film comprising inorganic material, formed over the first insulating film; a light emitting element having at least one electrode, a portion of the electrode formed on the second insulating film; and a second substrate opposed to the first substrate with a sealing material interposed therebetween, wherein the film comprising inorganic material has at least first and second openings at least between an edge of the first substrate and the electrode, wherein the first and second openings are arranged adjacent to each other in a narrower-side direction of the first and second openings, wherein each width of the first and second opening is 5 µm or more in the shorter-side direction of the first and second openings, wherein a distance between the first and second openings is less than 1 mm, and wherein the sealing material is overlapped with the electrode and the overlap is 15 µm or less.

The present invention can be applied to not only a light emitting device but also a semiconductor device. One of the structures of a semiconductor device according to the present invention for solving the problem includes a first substrate; a first insulating film comprising organic material, formed over the first substrate; a film comprising inorganic material formed on the first organic insulating film; a second insulating film covering an edge of the film comprising inorganic material, formed over the first insulating film; an electrode, a portion of the electrode formed on the second insulating film; and a second substrate opposed to the first substrate with a sealing material interposed therebetween, wherein the sealing material is formed on a portion of the film comprising inorganic material, wherein the film comprising inorganic material is not overlapped with the electrode, and wherein there is a gap between the sealing material and the electrode.

In addition, there are not so many wirings dragged from the outside of or from under a sealing material close to an upper electrode for a light-emitting element in the case of an actual active matrix panel. However, such a structure can be required to be formed, and deterioration occurs naturally from that part. The commercial value of a light-emitting device in which a periphery portion is not lighted due to deterioration is dramatically decreased even though the portion is just a part of the light-emitting device. Therefore, the structure according to the present invention can be preferably used also as a measure for a small portion at the periphery of a light-emitting element.

The light-emitting device according to the present invention, which has the structure described above, is a light-emitting device where periphery deterioration can be prevented from occurring even when an organic insulating film is used as an insulating film, and is also a light-emitting device where reliability for a long period of time can be improved.

BRIEF DESCRIPTION OF THE DRAWINGS

The patent or application file contains drawings executed in color. Copies of this patent or patent application publication with color drawings will be provided by the Office upon request and payment of the necessary fee.

In the accompanying drawings:

FIGS. 2A to 2C are diagrams showing one example of the structures of a light-emitting device according to the present invention;

FIGS. 3A to 3C are diagrams showing one example of the structures of a light-emitting device according to the present invention;

FIGS. 13A to 13D are experimental results relating to a light-emitting device that has the structure in Embodiment Mode 2;

FIGS. 14A to 14E are experimental results relating to a light-emitting device that has the structure in Embodiment Mode 3;

FIGS. 15A to 15D are experimental results relating to a light-emitting device that has the structure in Embodiment Mode 4;

DETAILED DESCRIPTION OF THE INVENTION

Figure 1A:
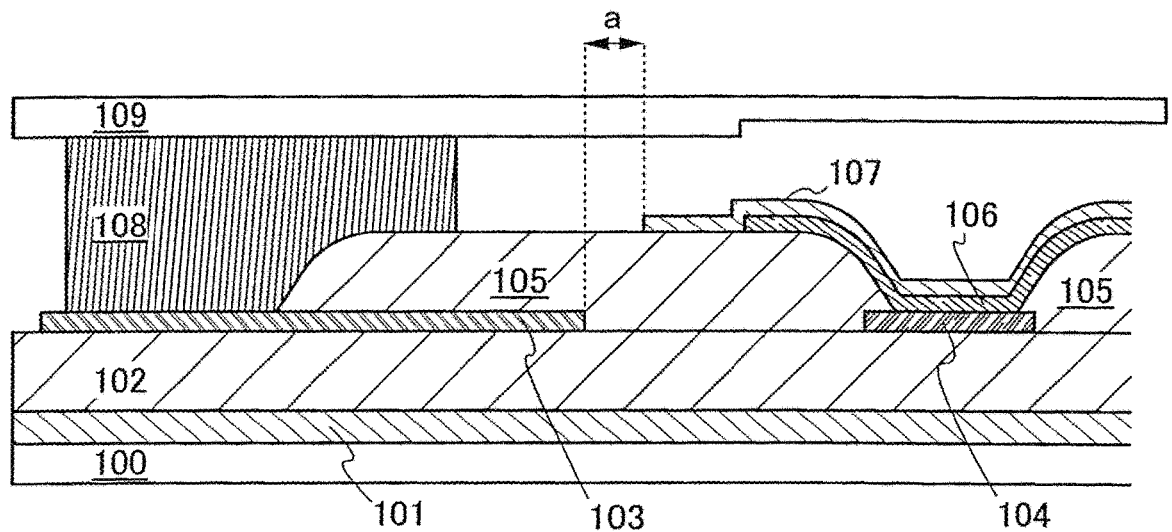
FIGS. 1A and 1B are diagrams showing examples of structures of a light-emitting device according to the present invention.

Embodiment Modes of the present invention will be described below. However, the present invention may be embodied in a lot of different forms, and it is to be easily understood that various changes and modifications will be apparent to those skilled in the art unless such changes and modifications depart from the scope of the present invention. Therefore, the present invention is not to be construed with limitation to what is described in the embodiment modes.

The inventors has found out that penetration of water from the outside atmosphere of the light emitting device is accelerated when an organic film sandwiched in contact with inorganic films (a laminated structure of an inorganic film, an organic film, and an inorganic film) is exposed to the outside atmosphere of the light emitting device.

In the case of a light-emitting device, the inorganic films correspond to a substrate, an opposed substrate, a wiring a passivation film, an electrode, and the like. When an insulating film is formed with the use of an organic material to have a structure in which the organic film is sandwiched in contact with any of the inorganic films described above, penetration of water from the outside atmosphere of the light emitting device is accelerated through the insulating film comprising organic material, and periphery deterioration thus proceeds. Although the reason of this phenomenon has not been clearly figured out, the inventors suspect that the surface tension between the organic film and the inorganic film is involved.

In the case of a light-emitting device, an electrode for a light-emitting element is nearly always formed by using an inorganic film. Therefore, a light-emitting device basically has a laminated structure of a substrate (inorganic), an insulating film or a light-emitting laminated body (organic), and an electrode (inorganic), and water under the electrode promptly reaches a light-emitting laminated body due to this laminated structure so that deterioration of the light-emitting laminated body is accelerated. Therefore, it is important as a measure to make it harder for water to reach under the electrode.

The present invention provides a light-emitting device including a first organic film formed in contact with a first insulating inorganic film (for example, a substrate), a second inorganic film (for example, a wiring or a passivation film) formed in contact with the first organic film, and a second organic film formed on the first organic film and the second inorganic film, where there are a gap between a third inorganic film that is an upper electrode for a light-emitting element, a portion of the third inorganic film being formed in contact with the second organic film, and the second inorganic film and a gap between the third inorganic film and a sealing material that is a third organic film for attaching an opposed substrate that is a fourth inorganic film when seen from the substrate side.

In the light-emitting device according to the present invention, which has the structure described above, the second inorganic film is not located under the third inorganic film, and the second organic film is thus exposed to the atmosphere within the light-emitting device without having contact with the second and third inorganic films at the gap between the second inorganic film and the third inorganic film. Therefore, even when water moves fast in the first organic film sandwiched between the first inorganic film and the second inorganic film, further penetration of water is so difficult at the gap that periphery deterioration due to water can be suppressed.

In addition, since the sealing material includes an organic material and has contact with the opposed substrate that is the fourth inorganic film, a structure in which an organic film is sandwiched between inorganic films is certainly formed when there is an inorganic film under the sealing material. Therefore, when seen from the substrate side, the gap between the sealing material and the third inorganic film that is the upper electrode for the light-emitting element is needed.

Further, the present invention provides a light-emitting device including a first organic film formed in contact with a first insulating inorganic film (for example, a substrate), a second inorganic film and a fifth in organic film (for example, wirings or passivation films) formed in contact with the first organic film, and a second organic film formed on the first organic film and the second and fifth inorganic films, a third inorganic film that is an upper electrode for a light-emitting element, a portion of the third inorganic film being formed in contact with the second organic film, and a sealing material that is a third organic film for attaching an opposed substrate that is a fourth inorganic film, where there are a gap between the second inorganic film and the fifth inorganic film and a gap between the third inorganic film and the sealing material when seen from the substrate side. In addition, the gap between the second inorganic film and the fifth inorganic film is positioned in a portion between the sealing material and the third inorganic film. The sealing material and the third inorganic film may be overlapped with a portion of the gap between the second inorganic film and the fifth inorganic film. However, the sealing material or the third organic film is not allowed to overlap with the gap entirely. It is preferable that the gap between the second inorganic film and the fifth inorganic film be 5 μm or more, preferably 10 μm or more, and more preferably 20 μm or more.

In the light-emitting device according to the present invention, which has the structure described above, there is the gap between the second inorganic film and the fifth inorganic film, and the second organic film is thus exposed to the atmosphere within the light-emitting device without contact with any inorganic film at the gap. Therefore, even when water moves fast in the first organic film sandwiched between the first inorganic film and the second inorganic film, water is held back at the gap, further penetration of water is difficult, and thus, periphery deterioration due to water can be suppressed. In addition, in this structure, water can be held back at the gap even when the fifth inorganic film is overlapped with the third inorganic film. Therefore, penetration of water into a light-emitting laminated body is so difficult that periphery deterioration can be suppressed.

In addition, since the sealing material includes an organic material and has contact with the opposed substrate that is the fourth inorganic film, a structure in which an organic film is sandwiched between inorganic films is certainly formed when there is an inorganic film under the sealing material. Therefore, when seen from the substrate side, the gap between the sealing material and the third inorganic film that is the upper electrode for the light-emitting element is needed.

Further, the present invention provides a light-emitting device including a first organic film formed in contact with a first insulating inorganic film (for example, a substrate), a second inorganic film (for example, a wiring or a passivation film) formed in contact with the first organic film, and a second organic film formed on the first organic film and the second inorganic film, a third inorganic film that is an upper electrode for a light-emitting element, a portion of the third inorganic film being formed in contact with the second organic film, and a sealing material that is a third organic film for attaching an opposed substrate that is a fourth inorganic film, where the second inorganic film has a portion that is less than 1 mm in width. In addition, in the light-emitting device, a distance where the third inorganic film is overlapped with the sealing material is 15 μm or less, or there is a gap between the third inorganic film and the sealing material.

In the light-emitting device, which has the structure described above, since the second inorganic film has the thin portion that is less than 1 mm in width, penetration of water is suppressed at the portion even when the first organic film is sandwiched between the first inorganic film and the second inorganic film. Therefore, even when the first organic film is exposed to the outside atmosphere of the light emitting device and the second inorganic film is overlapped with the third inorganic film, periphery deterioration can be suppressed.

In addition, since the sealing material includes an organic material and has contact with the opposed substrate that is the fourth inorganic film, a structure in which an organic film is sandwiched between inorganic films is certainly formed when there is an in organic film under the sealing material. For example, even in the case of a structure in which there is the first organic film on the first inorganic film, there is the second organic film thereon in contact with the first organic film, the sealing material is further formed thereon, and the fourth inorganic film is attached, penetration of water is considered to be accelerated. Therefore, when seen from the substrate side, the gap between the sealing material and the third inorganic film that is the upper electrode for the light-emitting element is needed.

Further, the present invention provides a light-emitting device including a first organic film formed in contact with a first insulating inorganic film (for example, a substrate), a second inorganic film (for example, a wiring or a passivation film) formed in contact with the first organic film, and a second organic film formed on the first organic film and the second inorganic film, a third inorganic film that is an upper electrode for a light-emitting element, a portion of the third inorganic film being formed in contact with the second organic film, and a sealing material that is a third organic film for attaching an opposed substrate that is a fourth inorganic film, where the second inorganic film has a plurality of openings each of which has the width of 5 or more in a narrower-side direction thereof between the third inorganic film and an edge of the substrate, the openings are arranged adjacent to each other in the narrower-side direction of the opening, and a distance between the adjacent openings is less than 1 mm. In addition, in the light-emitting device, a distance where the third inorganic film is overlapped with the sealing material is 15 μm or less, or there is a gap between the third inorganic film and the sealing material.

In the light-emitting device, which has the structure described above, since each of the openings have the width of 1 μm or more, preferably 5 μm or more in the narrower-side direction of the opening, the surface tension between the organic film and the inorganic film is reduced, and penetration of water is not accelerated even when the first organic film is sandwiched between the first inorganic film and the second inorganic film. Therefore, even when the first organic film is exposed to the outside atmosphere of the light emitting device and the second inorganic film is overlapped with the third inorganic film, periphery deterioration can be suppressed.

In addition, since the sealing material includes an organic material and has contact with the opposed substrate that is the fourth inorganic film, a structure in which an organic film is sandwiched between inorganic films is certainly formed when there is an in organic film under the sealing material. For example, even in the case of a structure in which there is the first organic film on the first inorganic film, there is the second organic film thereon in contact with the first organic film, the sealing material is further formed thereon, and the fourth inorganic film is attached, penetration of water is considered to be accelerated. Therefore, it is necessary that a distance where the sealing material is overlapped with the third inorganic film that is the upper electrode for the light-emitting element be 15 μm or less, or there be the gap between the sealing material and the third inorganic film.

Some modes for carrying out the present invention will be described with reference to with the accompanying drawings. It is to be noted that, when the description of a drawing refers to another drawing, the description of the referred-to drawing is applied except the difference between the two drawings.

In addition, there are not so many wirings dragged from the outside of or from under a sealing material close to an upper electrode for a light-emitting element in the case of an actual active matrix panel. However, such a structure can be required to be formed, and deterioration occurs naturally due to the structure. The commercial value of a light-emitting device in which a periphery portion is not lighted due to deterioration is dramatically decreased even though the portion is just a part of the light-emitting device. Therefore, the structure according to the present invention can be preferably used also as a measure for a small portion at the periphery of a light-emitting device.

Embodiment Mode 1

FIG. 1A is a cross-sectional view showing a cross section of a light-emitting device according to the present invention. A base insulating film 101 is formed on a substrate 100, and a first organic insulating film 102 is formed thereon. On the first organic insulating film 102, a wiring 103 is formed in contact with the first organic insulating film 102. Also on the first organic insulating film 102, a lower electrode 104 for a light-emitting element is provided, and a second organic insulating film 105 is formed to cover an edge portion of the lower electrode 104. In addition, a light-emitting laminated body 106 is provided continuously to cover the second organic insulating film 105 and an exposed portion of the lower electrode 104. Further, an upper electrode 107 for the light-emitting element is provided to cover the light-emitting laminated body 106. The substrate 100 over which the base insulating film 101, the first organic insulating film 102, the wiring 103, the lower electrode 104 for the light-emitting element, the second organic insulating film 105, the light-emitting laminated body 106, and the upper electrode 107 for the light-emitting element are formed attached to an opposed substrate 109 with a sealing material 108.

Further, there is a gap a between an edge of the upper electrode 107 for the light-emitting element and an edge of the wiring 103 extending from the outside of sealing material 108 in the direction parallel with the substrate. The edge of the wiring 103 is not overlapped with the edge of the upper electrode 107. In addition, there is also a gap between the sealing material 108 and the upper electrode 107. It is to be noted that the same can be said also when the wiring 103 is not projecting from the sealing material 108.

As materials for the substrate 100 and the opposed substrate 109, inorganic substances such as quartz and organic substances such as plastics (for example, polyimide, acrylic, polyethyleneterephtalate, polycarbonate, polyacrylate, and polyethersulfone) can be used. These substrates may be used after polishing such as CMP if necessary. In the present embodiment mode, glass substrates are used. It is to be noted that the substrate 100 is treated as an organic material when a plastic substrate is used in the present invention.

The base insulating film 101 is provided for preventing diffusions of metals such as an alkali metal or an alkali-earth metal in the substrate 100, which have a possibility of having a bad influence by diffusing. As a material for the base insulating film 101, insulating inorganic substances such as silicon oxide, silicon nitride, silicon oxide containing nitride, and silicon nitride containing oxygen can be used. In the present embodiment mode, the base insulating film 101 is formed by using silicon nitride. Although the base insulating film 101 is formed by a single layer in the present embodiment mode, a multilayer of two or more layers may be employed. Alternatively, it is not necessary to provide the base insulating film 101 when diffusions of impurities from the substrate are negligible.

The first organic insulating film 102 is formed by using an organic insulating material such as acrylic or polyimide, a material that has a frame structure formed by a bond of silicon and oxygen and has one or both of an organic group including at least hydrogen (for example, an alkyl group or an aryl group) and a fluoro group as substituents, so-called siloxane, or the like. In particular, a self-flatness insulating film that can be formed by coating can reduce unevenness of the underlying layer, and can be preferably used for a light-emitting device.

The wiring 103 can be formed by using an inorganic substance such as a metal film of conductive aluminum, copper, or the like, and may have either a single layer or a multilayer.

The lower electrode 104 and upper electrode 107 for the light-emitting element is formed by using a material that makes it possible for the light-emitting laminated body 106 to emit light by applying a higher voltage to one of the lower electrode 104 and the upper electrode 107. A light-transmitting conductive film is used as the electrode to which light generated in the light-emitting laminated body 106 is emitted, for which oxides as typified by ITO (indium tin oxide) are known. In addition, ITO containing silicon (ITSO), IZO (indium zinc oxide) of indium oxide mixed with 2 to 20% zinc oxide (ZnO), zinc oxide, GZO (Gallium Zinc Oxide) of zinc oxide containing gallium, and the like can be used for the light-emitting conductive film, and an ultrathin metal film made thinner to have a light-transmitting property can be also used.

As for other electrode materials, gold (Au), platinum (Pt), nickel (Ni), tungsten (W), chromium (Cr), molybdenum (Mo), iron (Fe), cobalt (Co), copper (Cu), palladium (Pd), or a nitride of a metal material (TiN) is used for the electrode to which a higher potential is mainly applied. The other electrode can be formed with the use of an alkali metal such as lithium (Li) or cesium (Cs), an alkali-earth metal such as magnesium (Mg), calcium (Ca) or strontium (Sr), an alloy (Mg:Ag or Al:Li) or a compound (LiF, CsF, or CaF$_2$) including the alkali metal or the alkali-earth metal, or a transition metal such as a rare-earth metal, and a lamination layer of the alkali, alkali-earth, transition metal and a metal such as aluminum (Al), silver (Ag), or ITO can also be used to form the other electrode.

For the sealing material 108, it is preferable to use an ultraviolet curable resin or the like. In the sealing material 108, a desiccant or particles for keeping the gap between the substrates constant may be mixed.

In the light-emitting device according to the present invention, which has this structure described above in at least a portion of a periphery portion of the light-emitting device, a laminated structure of an inorganic film, an organic film, and an inorganic film is eliminated at the gap a, and the existence of the gap a makes coming water held back and makes it possible to suppress progression of periphery deterioration in the portion that has the structure. Although it is preferable that the structure as in the present embodiment mode be provided around the periphery of the light-emitting device, only a portion of the periphery may have the structure, and it becomes possible to suppress periphery deterioration from the portion that has this structure. In addition, the light-emitting device according to the present invention, which has this structure, is a light-emitting device where reliability for a long period of time can be improved.

Further, the sealing material 108 is also an organic film, and is sandwiched in contact with the opposed substrate 109 and the wiring 103. Since the sealing material 108 is exposed to the outside atmosphere of the light emitting device, the light-emitting device is made to have a structure into which water easily comes. However, periphery deterioration is not accelerated since no more organic film is sandwiched in contact with the wiring 103 and the opposed substrate 109, which is an inorganic film, at the inside of the sealing material 108, that is, the region surrounded by the sealing materials.

In addition, there are not so many wirings dragged from the outside of or from under a sealing material close to an upper electrode for a light-emitting element in the case of an actual active matrix panel. However, such a structure can be required to be formed, and deterioration occurs naturally from that part. The commercial value of a light-emitting device in which a periphery portion is not lighted due to deterioration is dramatically decreased even though the portion is just a part of the light-emitting device. Therefore, the structure according to the present invention can be preferably used also as a measure for a small portion at the periphery of a light-emitting element.

It is to be noted that it is preferable to provide a desiccant in a region surrounded by the sealing materials. A desiccant can be provided by being attached to the inside of a concave portion formed for the opposed substrate 109. Providing a desiccant makes it possible to suppress deterioration for a longer period of time.

Embodiment Mode 2

Figure 1B:
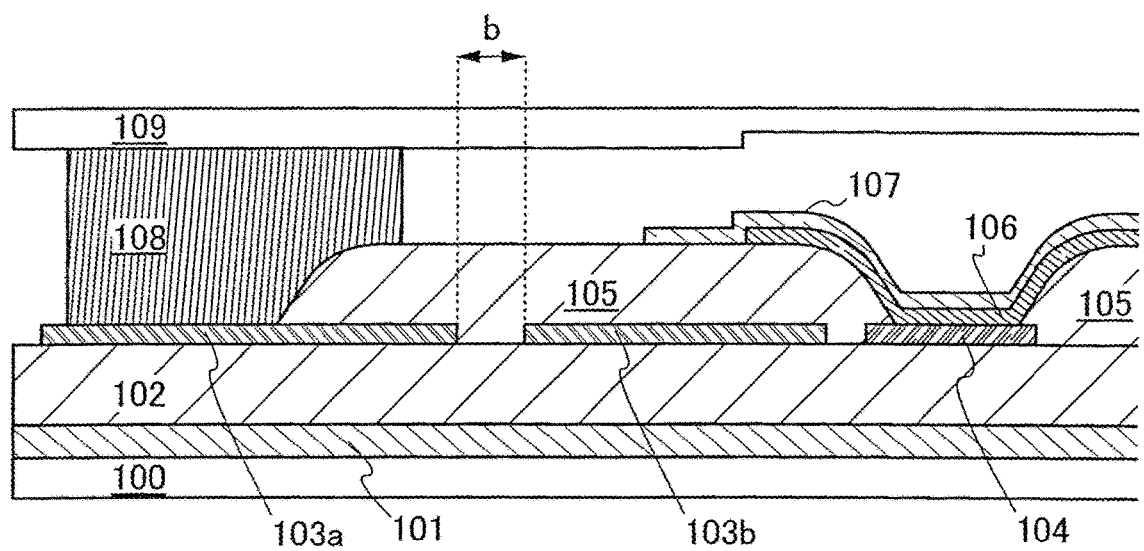

FIG. 1B shows one of structures of a light-emitting device according to the present invention. For the same components as those in FIG. 1A, the same reference numerals and the same materials can be used. In addition, refer to the description for FIG. 1A since a repeated description is omitted.

FIG. 1B is different from FIG. 1A in the structure of the wiring 103 shown in FIG. 1A. In FIG. 1B, two wirings of wirings 103a and 103b are formed. The wirings 103a and 103b have the same material and structure as those of the wiring 103, a portion of the wiring 103a is exposed outside a sealing material 108, a gap b is provided between the wirings 103a and 103b. The gap b may be provided in a portion between the sealing material 108 and an upper electrode 107 for a light-emitting element. Any of the sealing material 108 and the upper electrode 107 may be overlapped with a portion of the gap b, but is not allowed to be overlapped with all of the gap b. In addition, it is preferable that the width of the gap b be 5 µm or more, preferably 10 µm or more, and more preferably 20 µm or more.

In the light-emitting device according to the present invention, which has the structure described above, a first organic insulating film 102 is formed between the base insulating film 101 and the wiring 103a to be in contact with the both. Since the first organic insulating film 102 is exposed to the outside atmosphere of the light emitting device, water comes into the first organic insulating film 102 at a fat speed. However, a laminated structure in which an inorganic substance, an organic substance, and an inorganic substance are laminated in order, into which water comes easily, is not formed at the gap b. Therefore, it is difficult for water at an edge of the wiring 103a to come further into the inside so that periphery deterioration can be suppressed. It is to be noted that the same can be said also when the wiring 103a is not formed outside the sealing material 108 and the edge at the periphery of the light-emitting device is covered with the sealing material 108.

In addition, when this structure is employed, periphery deterioration can be suppressed even though the wiring 103b is formed also under the upper electrode for the light-emitting element.

Although it is preferable that the structure as in the present embodiment mode be provided around the periphery of the light-emitting device, only a portion of the periphery may have the structure, and it becomes possible to suppress periphery deterioration from the portion that has this structure. In addition, the light-emitting device according to the present invention, which has this structure, is a light-emitting device where reliability for a long period of time can be improved.

In addition, there are not so many wirings dragged from the outside of or from under a sealing material close to an upper electrode for a light-emitting element in the case of an actual active matrix panel. However, such a structure can be required to be formed, and deterioration due to the structure occurs naturally. The commercial value of a light-emitting device in which a periphery portion is not lighted due to deterioration is dramatically decreased even though the portion is just a part of the light-emitting device. Therefore, the structure according to the present invention can be preferably used also as a measure for a small portion at the periphery of a light-emitting element.

It is to be noted that it is preferable to provide a desiccant in the inside space surrounded by the sealing material 108. A desiccant can be provided by being attached to the inside of a concave portion formed in the opposed substrate 109. Providing a desiccant makes it possible to suppress deterioration for a longer period of time.

It is to be noted that the structure in the present embodiment mode can be used in combination with the structures of the other embodiment modes.

Embodiment Mode 3

FIGS. 2A to 2C show one of structures of a light-emitting device according to the present invention. For the same components as those in FIG. 1A, the same reference numerals and the same materials can be used. In addition, refer to the description for FIG. 1A since a repeated description is omitted. It is to be noted that FIG. 2A is a cross-sectional view of FIG. 2B along the line A-B and FIG. 2C is a cross-sectional view of FIG. 2B along the line C-D.

FIG. 2A is different from FIG. 1A in the structure that a wiring 103 has a width c that is less than 1 mm, preferably 100 µm or less, in the narrower-side direction of the wiring 103. By this structure, periphery deterioration can be suppressed even when the wiring 103 is continuously formed from outside the sealing material 108 under an upper electrode 107 for a light-emitting element.

In addition, in the present embodiment mode, the sealing material 108 may be overlapped with the upper electrode 107 for the light-emitting element as long as the overlap is 15 μm or less. Further, of course, there may be a gap between the sealing material 108 and the upper electrode 107.

It is to be noted that the structure in the present embodiment can be used in combination with the description in Embodiment Mode 1 or 2.

In addition, there are not so many wirings dragged from the outside of or from under a sealing material close to an upper electrode for a light-emitting element in the case of an actual active matrix panel. However, such a structure can be required to be formed, and deterioration due to the structure occurs naturally. The commercial value of a light-emitting device in which a periphery portion is not lighted due to deterioration is dramatically decreased even though the deteriorated portion is just a part of the light-emitting device. Therefore, the structure according to the present invention can be preferably used also as a measure for a small portion at the periphery of a light-emitting element.

It is to be noted that it is preferable to provide a desiccant in a region surrounded by the sealing materials. A desiccant can be provided by being attached to the inside of a concave portion formed in the opposed substrate 109. Providing a desiccant makes it possible to suppress deterioration for a longer period of time.

It is to be noted that the structure in the present embodiment mode can be used in combination with the structures of the other embodiment modes.

Embodiment Mode 4

FIGS. 3A to 3C show one of structures of a light-emitting device according to the present invention. For the same components as those in FIG. 1A, the same reference numerals and the same materials can be used. In addition, refer to the description for FIG. 1A since a repeated description is omitted. It is to be noted that FIG. 3A is a cross-sectional view of FIG. 3B along the line A-B and FIG. 3C is a cross-sectional view of FIG. 3B along the line C-D.

A wiring 153 in FIG. 3B has a plurality of wirings 103 arranged, where each of the wirings 103 is the wiring 103 shown in FIG. 2B. The wiring 103 has a width c that is less than 1 mm, preferably 100 μm or less, in the narrower-side direction of the wiring 103, and the distance d between the wirings 103 is 1 μm or more, preferably 5 μm. When the wiring 153 has a portion where the width c is less than 1 mm, preferably 100 μm or less, and the distance d between the wirings 103 is 1 μm or more, preferably 5 μm, periphery deterioration can be suppressed even when the wiring 153 is continuously formed from outside the sealing material 108 under an upper electrode 107 for a light-emitting element.

In addition, in the present embodiment mode, the sealing material 108 may be overlapped with the upper electrode 107 for the light-emitting element as long as the overlap is 15 μm or less. Further, of course, there may be a gap between the sealing material 108 and the upper electrode 107.

In addition, there are not so many wirings dragged from the outside of or from under a sealing material close to an upper electrode for a light-emitting element in the case of an actual active matrix panel. However, such a structure can be required to be formed, and deterioration due to the structure occurs naturally. The commercial value of a light-emitting device in which a periphery portion is not lighted due to deterioration is dramatically decreased even though the portion is just a part of the light-emitting device. Therefore, the structure according to the present invention can be preferably used also as a measure for a small portion at the periphery of a light-emitting element.

It is to be noted that it is preferable to provide a desiccant in a region surrounded by the sealing materials. A desiccant can be provided by being attached to the inside of a concave portion formed in the opposed substrate 109. Providing a desiccant makes it possible to suppress deterioration for a longer period of time.

It is to be noted that the structure in the present embodiment mode can be used in combination with the structures of the other embodiment modes.

Embodiment Mode 5

Figure 4A:
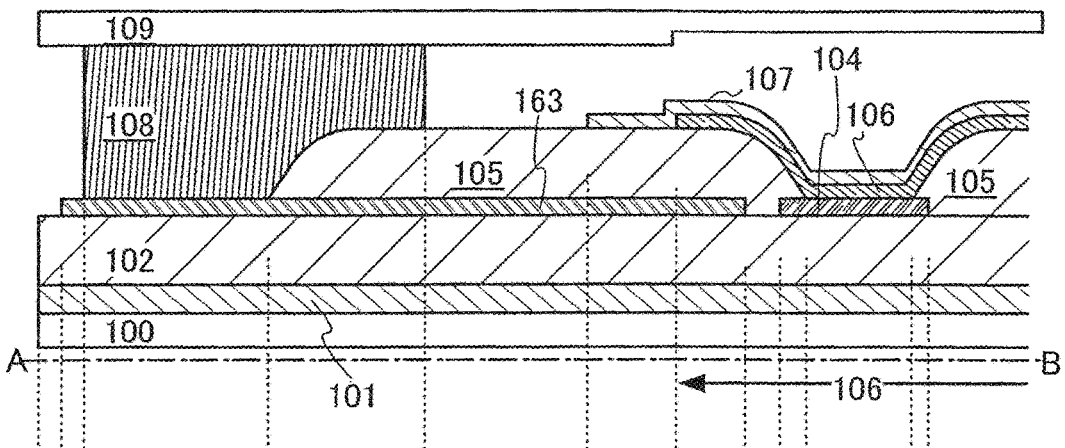
FIGS. 4A to 4C are diagrams showing one example of the structures of a light-emitting device according to the present invention.
Figure 4B:
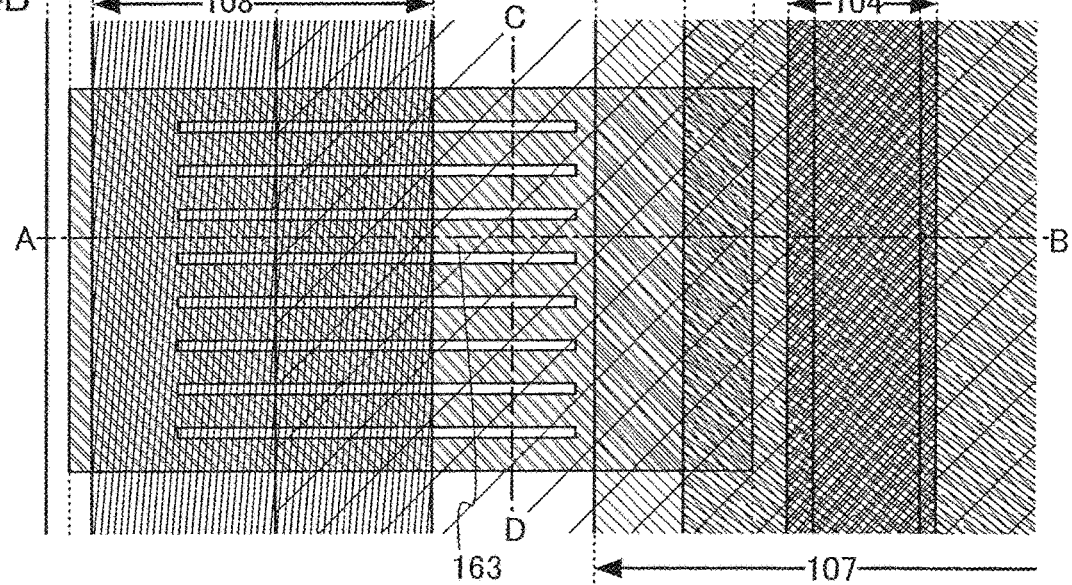
Figure 4C:
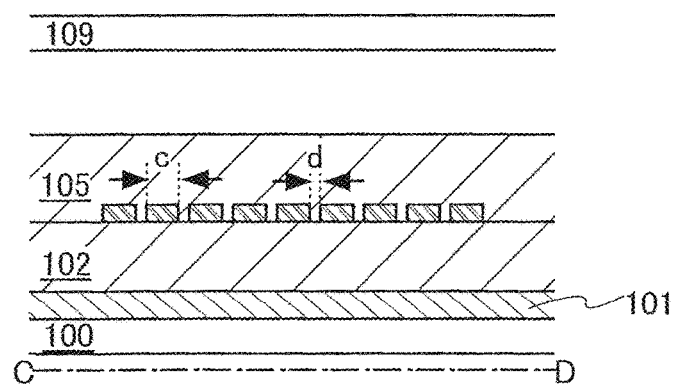

FIGS. 4A to 4C show one of structures of a light-emitting device according to the present invention. For the same components as those in FIG. 1A, the same reference numerals and the same materials can be used. In addition, refer to the description for FIG. 4A since a repeated description is omitted. It is to be noted that FIG. 4A is a cross-sectional view of FIG. 4B along the line A-B and FIG. 4C is a cross-sectional view of FIG. 4B along the line C-D.

Between the substrate edge and an upper electrode 107 for a light-emitting element, a wiring 163 in FIG. 4B has a plurality of openings that are 1 μm or more, preferably 5 μm or more, in width in the narrower-side direction of the opening between the substrate edge and an upper electrode 107 for a light-emitting element. The plurality of openings are arranged adjacent to each other in the narrower-side direction of the opening, and the length between the adjacent openings is less than 1 mm. This makes it possible to suppress periphery deterioration without accelerating penetration of water even when the wiring 163 is continuously formed from outside a sealing material 108 under the upper electrode 107 for the light-emitting element.

In addition, in the present embodiment mode, the sealing material 108 may be overlapped with the upper electrode 107 for the light-emitting element as long as the overlap is 15 μm or less. Further, of course, there may be a gap between the sealing material 108 and the upper electrode 107.

In addition, there are not so many wirings dragged from the outside of or from under a sealing material close to an upper electrode for a light-emitting element in the case of an actual active matrix panel. However, such a structure can be required to be formed, and deterioration due to the structure occurs naturally. The commercial value of a light-emitting device in which a periphery portion is not lighted due to deterioration is dramatically decreased even though the deteriorated portion is just a part of the light-emitting device. Therefore, the structure according to the present invention can be preferably used also as a measure for a small portion at the periphery of a light-emitting element.

It is to be noted that it is preferable to provide a desiccant in a region surrounded by the sealing materials. A desiccant can be provided by being attached to the inside of a concave portion formed in the opposed substrate 109. Providing a desiccant makes it possible to suppress deterioration for a longer period of time.

It is to be noted that the structure in the present embodiment mode can be used in combination with the structures of the other embodiment modes.

Embodiment Mode 6

Figure 5A:
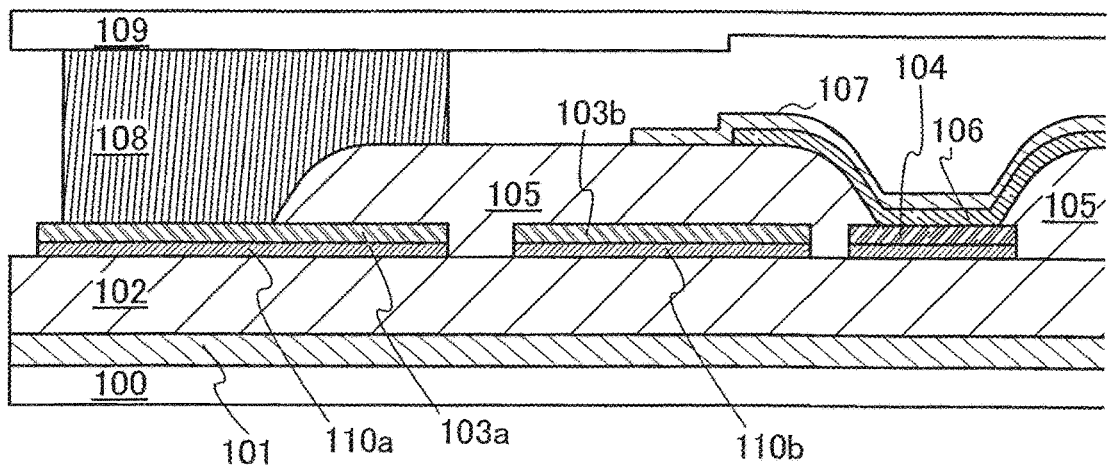
FIGS. 5A to 5C are diagrams showing one example of the structures of a light-emitting device according to the present invention.
Figure 5B:
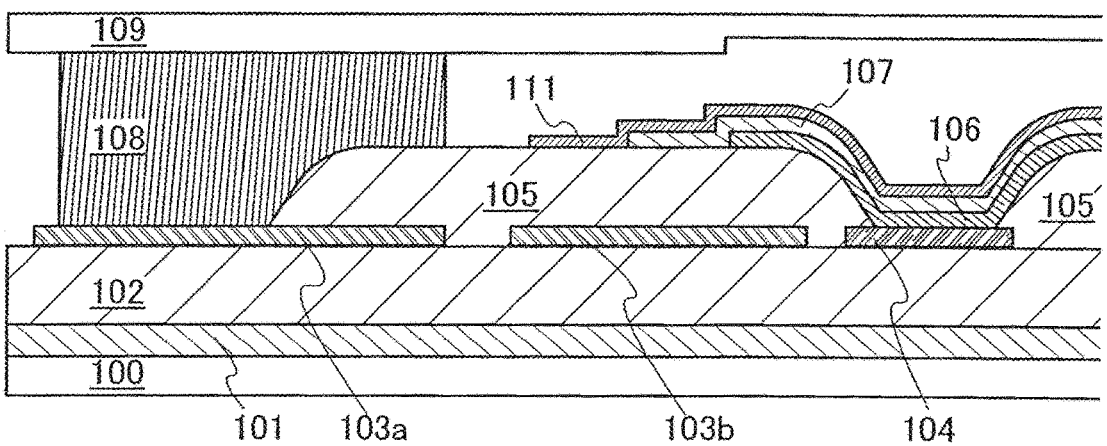
Figure 5C:
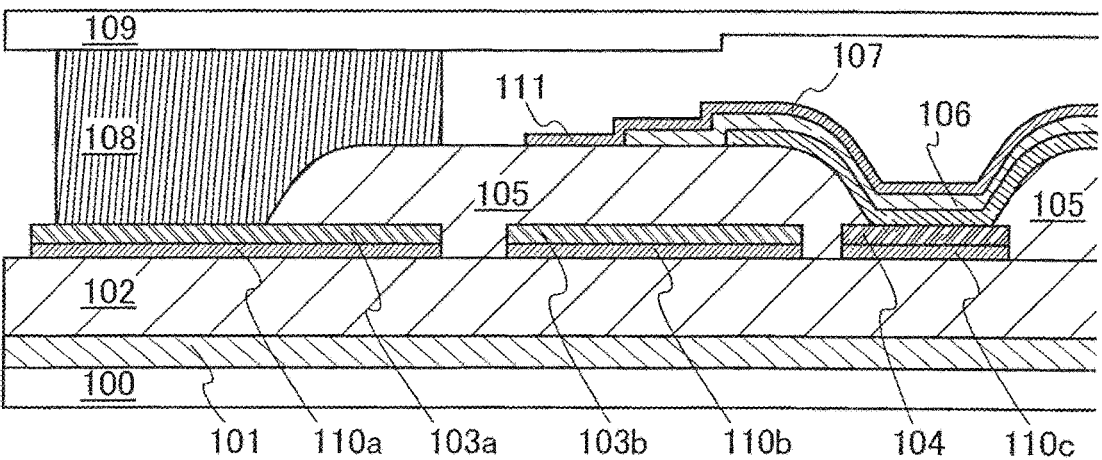

FIGS. 5A to 5C shows some structures of a light-emitting device according to the present invention. For the same components as those in FIG. 1A, the same reference numerals and the same materials can be used.

FIG. 5A shows a structure that is similar to the structure shown in FIG. 1B, where passivation films 110a and 110b are respectively formed under wirings 103a and 103b. The passivation films 110a and 110b are formed by using an insulating film including silicon as its main component, and composed of an inorganic film. It can be said that the inorganic film has a two-layer structure of the passivation film and the wiring. Alternatively, the inorganic film can be a wiring that has a two-layer structure when the passivation films 110a and 110b are formed by using a conductive material.

FIG. 5B shows a structure that is similar to the structure shown in FIG. 1B, where a passivation film 111 is formed in contact with an upper electrode 107 for a light-emitting element. The passivation film 111 can be formed by an insulating film including silicon as its main component, and in that case, which is an inorganic film. Therefore, when the gap between wirings 103a and 103b is formed in a region between a sealing material 108 and the passivation film 111, a structure according to the present invention can be satisfied so that periphery deterioration can be suppressed.

It is to be noted that the passivation film 111 can be considered to be composed of an organic material, and in that case, may be treated as the same structure as that in FIG. 1B.

FIG. 5C shows a light-emitting device that has both the structures shown in FIGS. 5A and 5B. This structure may be employed.

It is to be noted the present embodiment mode can be applied to other structures although the structure shown in FIG. 1B is given as an example for the descriptions in the present embodiment mode. In addition, the structures in the embodiment mode can be used in combination with the structures in the other embodiment modes.

Embodiment Mode 7

FIGS. 6A to 6C and FIGS. 7A and 7B show some structures of a light-emitting device according to the present invention. For the same components as those in FIG. 1A, the same reference numerals and the same materials can be used.

Figure 6A:
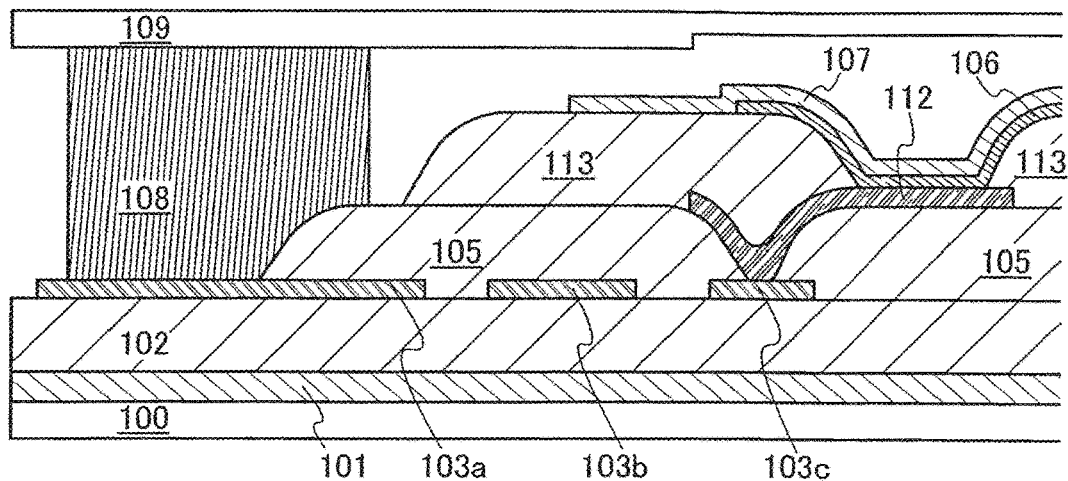
FIGS. 6A to 6C are diagrams showing one example of the structures of a light-emitting device according to the present invention.

FIG. 6A shows an example in which a lower electrode 112 for a light-emitting element and wirings 103a and 103b are formed on different insulating films. The lower electrode 112 for the light-emitting element is electrically connected to a wiring 103c through a contact hole provided in a second organic insulating film 105. The lower electrode 112 has an edge portion covered with a third organic insulating film 113, and on the third organic insulating film 113, a light-emitting laminated body 106 is continuously formed to cover an exposed portion of the lower electrode 112. Further, an upper electrode 107 for the light-emitting element is provided to cover the light-emitting laminated body 106. A substrate 100 with a base insulating film 101, a first organic insulating film 102, the wirings 103a, 103b, and 103c, the lower electrode 112 for the light-emitting element, the second organic insulating film 105, the light-emitting laminated body 106, and the upper electrode 107 for the light-emitting element is attached to an opposed substrate 109 with a sealing material 108.

The third organic insulating film 113 is formed to cover the lower electrode 112, and is also formed on the second organic insulating film 105. Therefore, a laminated structure of the second organic insulating film 105 and the third organic insulating film 113 is formed. An edge portion of the third organic insulating film 113 is formed so as not to be overlapped with an edge portion of the second organic insulating film 105, that is, closer to the light emitting than the edge portion of the second organic insulating film 105. It is preferable that the edge portion of the third organic insulating film 113 be formed closer to the light emitting than a portion of the second organic insulating film 105 from which the film thickness thereof is decreased toward the edge portion thereof.

As described above, also in the example where the lower electrode 112 for the light-emitting element and the wirings 103a and 103b are formed on different insulating films, providing a gap between the wirings 103a and 103b and a gap between the sealing material 108 and the upper electrode 107 for the light-emitting element makes it possible to suppress penetration of water in a portion where the two gaps are overlapped with each other, and in addition, which leads to suppression of periphery deterioration.

Figure 6B:
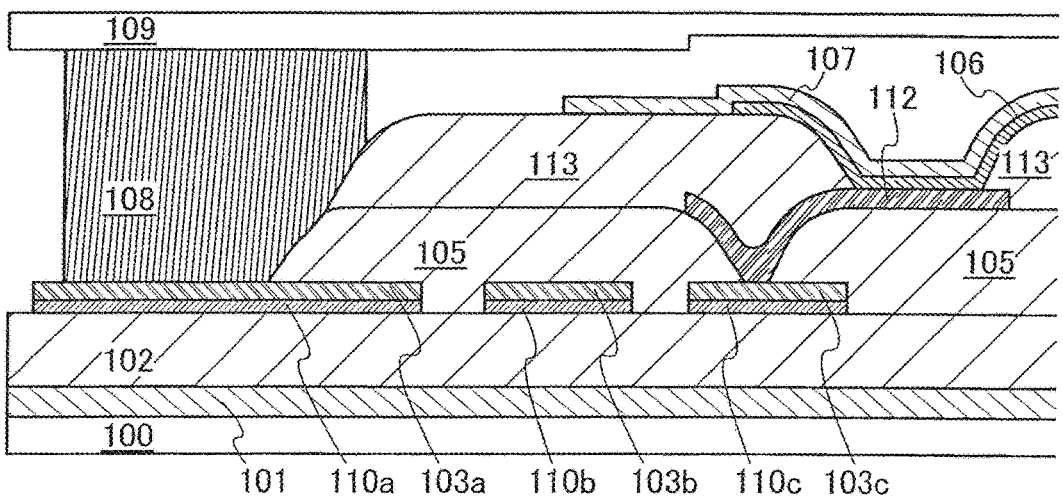

FIG. 6B shows a structure in which the structure shown in FIG. 6A and the structure shown in FIG. 5A are combined. Also in this structure, providing a gap between a lamination of a wiring 103a and a passivation film 110a and a lamination of a wiring 103b and a passivation film 110b and a gap between a sealing material 108 and a upper electrode 107 for a light-emitting element makes it possible to suppress penetration of water in a portion where the two gaps are overlapped with each other, and in addition, which leads to suppression of periphery deterioration.

Figure 6C:
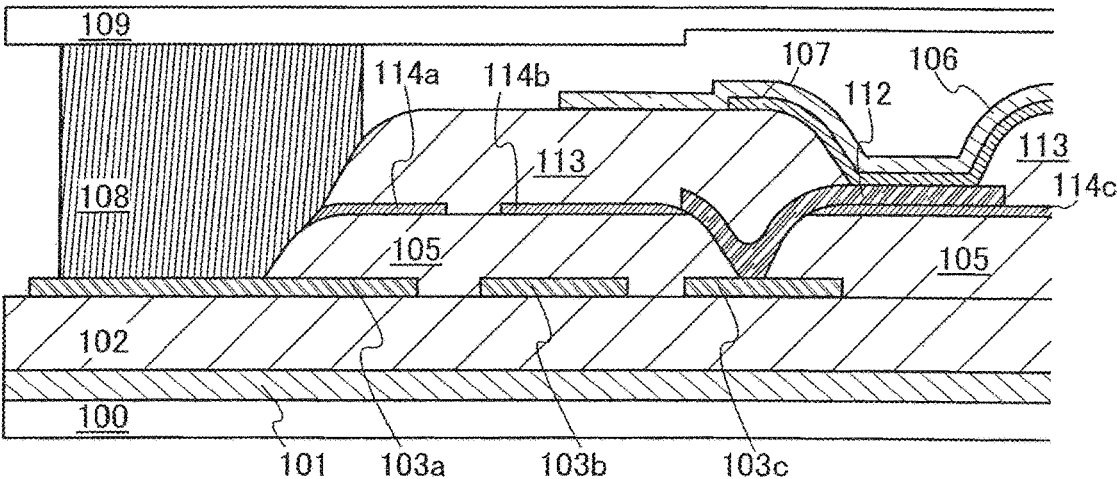

FIG. 6C shows an example in which a passivation films 114a, 114b, and 114c below a lower electrode 112 for a light-emitting element is added to the structure shown in FIG. 6A. The passivation films 114a, 114b, and 114c is formed by using an insulating film including silicon as its main component, and composed of an inorganic film. In this case, it is necessary that a gap be provided between the passivation films 114a and 114b to be overlapped with at least a portion of the gap wirings 103a and 103b.

As described above, also in the example where the passivation films 114a, 114b, and 114c below the lower electrode 112 for the light-emitting element are formed, providing a gap between the wirings 103a and 103b and a gap between the passivation films 114a and 114b and overlapping the gaps partly make it possible to suppress penetration of water in a portion where the two gaps and a gap between a sealing material 108 and an upper electrode 107 for the light-emitting element are overlapped with each other, and in addition, which leads to suppression of periphery deterioration.

Figure 7A:
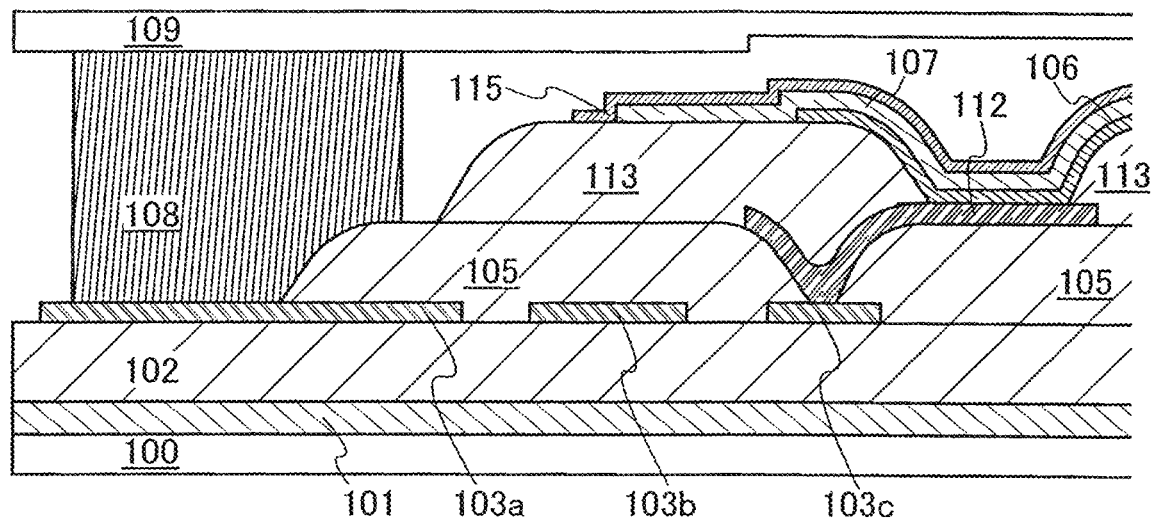
FIGS. 7A and 7B are diagrams showing one example of the structures of a light-emitting device according to the present invention.

FIG. 7A shows a structure in which the structure shown in FIG. 6A is combined with the structure shown in FIG. 5B to provide a passivation film 115 on an upper electrode 107 for a light-emitting element. Also in this structure, providing a gap between wirings 103a and 103b and a gap between a sealing material 108 and the passivation film 115 makes it possible to suppress penetration of water in a portion where the two gaps are overlapped with each other, and in addition, which leads to suppression of periphery deterioration.

Figure 7B:
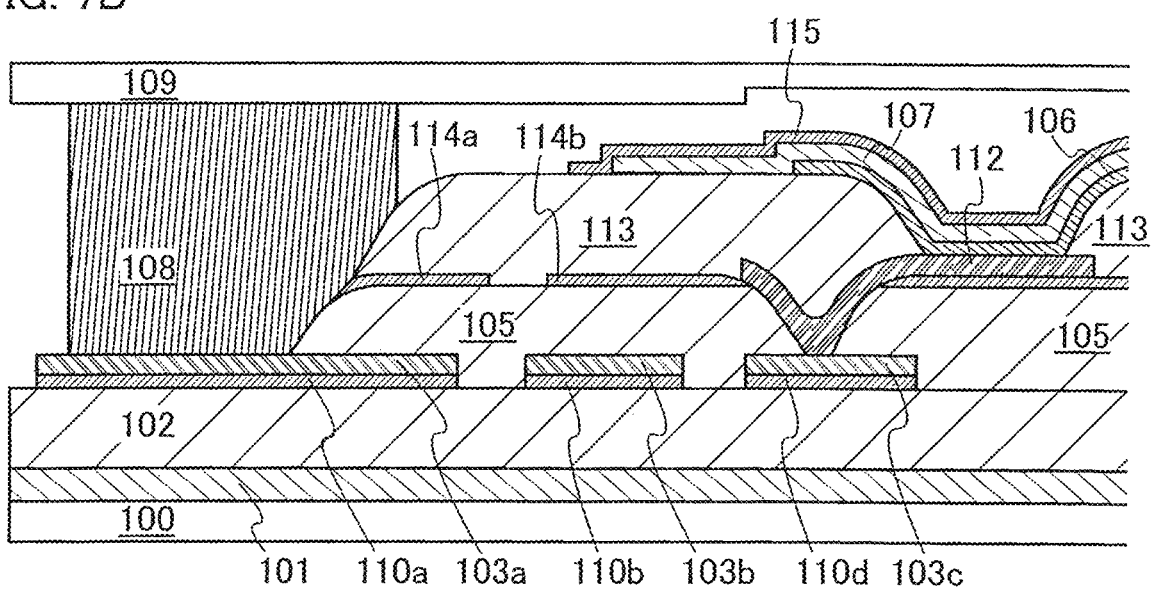

FIG. 7B shows a structure in which the structures shown in FIGS. 6A to 6C and FIG. 7A are combined. Also in this structure, providing a gap between the wirings 103a and 103b and a gap between the passivation films 114a and 114b and overlapping the gaps partly make it possible to suppress penetration of water in a portion where the two gaps and a gap between a sealing material 108 and a passivation film 115 are overlapped with each other, and in addition, which leads to suppression of periphery deterioration.

It is to be noted that the lower electrode 112 for the light-emitting element can be formed by using the same material for the lower electrode shown in FIG. 1A and that the third organic insulating film 113 can be formed by using the same material for the first organic insulating film 102 or the second organic insulating film 105.

It is to be noted that the structures in the present embodiment mode can be used in combination with the structures of the other embodiment modes.

Embodiment Mode 8

Subsequently, a method for manufacturing a light-emitting device according to the present invention will be described with references to FIGS. 8A to 8D and FIGS. 9A to 9C.

First, after forming a first base insulating layer 201 and a second base insulating layer 202 over a substrate 200.

Glass, quartz, plastic (such as polyimide, acrylic, polyethylene terephthalate, polycarbonate, polyacrylate, or polyethersulfone), or the like can be used as a material for the substrate 200. The substrate may be used after being polished by CMP or the like, if necessary. In the present embodiment mode, a glass substrate is used.

The first base insulating layer 201 and the second base insulating layer 202 are provided in order to prevent an element that has a damaging effect on characteristics of a semiconductor film, such as an alkali metal or an alkaline earth metal contained in the substrate 200, from diffusing into the semiconductor layer 203. Silicon oxide, silicon nitride, silicon oxide containing nitrogen, silicon nitride containing oxygen, or the like can be used as a material thereof. In the present embodiment, the first base insulating layer 201 and the second base insulating layer 202 are formed by using silicon nitride, silicon oxide respectively. Although a base insulating layer is formed by two layers of the first base insulating layer 201 and the second insulating layer 202 in the present embodiment, the base insulting layer may be formed by a single layer, or by a multilayer of two or more layers. Alternatively, it is not necessary to provide the base insulating film when diffusions of impurities from the substrate are negligible.

An amorphous silicon film is formed to be 25 to 100 nm (preferably, 30 to 60 nm) in thickness on the second base insulating layer 202. A known method such as sputtering, low pressure CVD, or plasma CVD can be used as a manufacturing method thereof. Subsequently, a heat treatment at 500° C. for one hour is performed for dehydrogenation.

Then, the amorphous silicon film is crystallized with the use of a laser irradiation system to form a crystalline silicon film. As to the laser crystallization in the present embodiment mode, an excimer laser is used, and an emitted laser beam is processed with an optical system to be a linear beam spot. The amorphous silicon film is irradiated with the linear beam spot to be a crystalline silicon film, which is used as the semiconductor film.

As another method for crystallizing an amorphous silicon film, there is a method of performing crystallization only by heat treatment, a method of performing crystallization by heat treatment with the use of a metal element that promotes crystallization, or the like. Nickel, iron, palladium, tin, lead, cobalt, platinum, copper, gold, and the like can be used as the element that promotes crystallization. By using the element, crystallization can be performed at a lower temperature in a shorter time, compared to the case of performing crystallization only by heat treatment. Therefore, a glass substrate or the like is less damaged. In the case of performing crystallization only by heat treatment, a highly heat-resistant quartz substrate or the like may be used as the substrate 200.

Subsequently, addition of a small amount of impurity, so-called channel doping, is performed to the semiconductor film to control a threshold voltage, if necessary. An n-type or p-type impurity (phosphorus, boron, or the like) is added by an ion doping method to obtain a required threshold voltage.

Figure 8A:
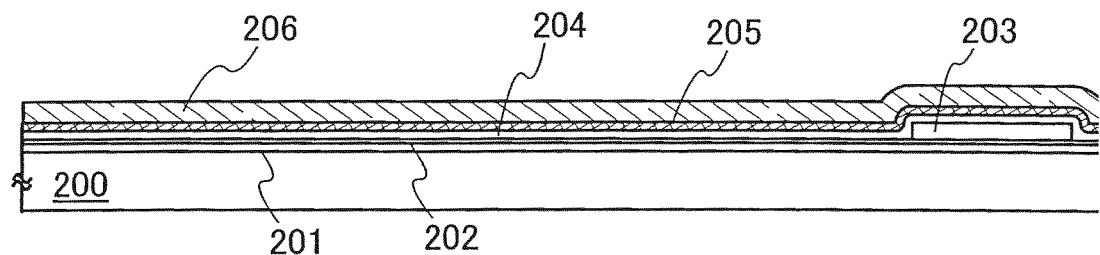
FIGS. 8A to 8D are diagrams illustrating a method for manufacturing a light-emitting device according to the present invention.

Thereafter, patterning of the semiconductor film is performed into a predetermined shape as shown in FIG. 8A to obtain the island-shaped semiconductor layer 203. The patterning is performed in such a way that a photoresist is applied to the semiconductor film, exposed to light to have a predetermined mask shape, and baked to form a resist mask on the semiconductor film, and etching is performed by using the mask.

Subsequently, a gate insulating film 204 is formed to cover the semiconductor layer 203. Then, a first conductive layer 205 and a second conductive layer 206 are formed on the gate insulating film 204 (FIG. 8A). The gate insulating film 204 is an insulating layer containing silicon and formed by plasma CVD or sputtering to be 40 to 150 nm in thickness. In the present embodiment, the gate insulating layer 204 is formed by using silicon oxide.

The first conductive film 205 and the second conductive film 206 may be formed by using an element selected from tantalum, tungsten, titanium, molybdenum, aluminum, copper, chromium, and niobium, or by using an alloy material or compound material mainly containing the element. A semiconductor film typified by a polycrystalline silicon film doped with an impurity element such as phosphorus may be used. Alternatively, an AgPdCu alloy may be used.

Figure 8B:
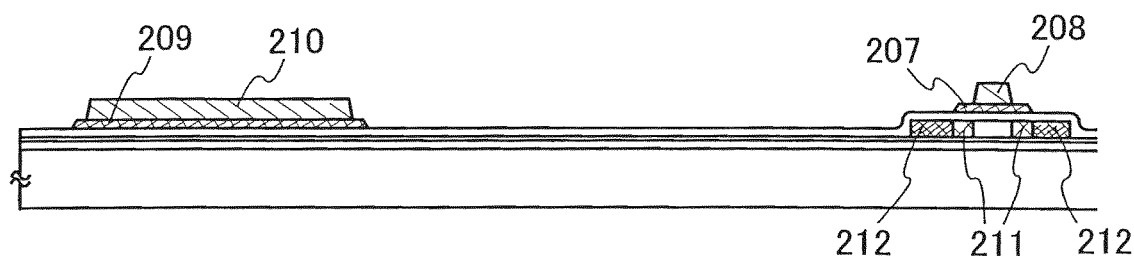

Next, the first conductive film 205 and the second conductive film 206 on the gate insulating film 204 are etched to form a gate electrode that has a first conductive layer 207 and a second conductive layer 208 and an external connecting portion that has a first conductive layer 209 and a second conductive layer 210, where the gate electrode is overlapped with the semiconductor layer 203 with the gate insulating film interposed therebetween (FIG. 8B). In the present embodiment mode, tantalum nitride (TaN) with a film thickness of 30 nm as the first conductive film 205 is formed on the gate insulating film 204, and tungsten (W) with a film thickness of 370 nm as the second conductive film 206 is formed thereon. It is to be noted that, although the first conductive film 205 is TaN with the film thickness of 30 nm and the second conductive film 206 is W with the film thickness of 370 nm in the present embodiment mode, the first conductive film 205 and the second conductive film 206 may be formed to have thicknesses in the ranges of 20 to 100 nm and 100 to 400 nm respectively. Further, although a laminated structure of the two layers is employed in the present embodiment, a single layer structure may be employed, or a laminated structure of three or more layers may be employed.

Then, in order to form the gate electrode, the external connecting portion, and a wiring that is not illustrated by etching the first conductive film 205 and the second conductive film 206, a mask, for example, a resist mask is formed through exposure to light by photolithography. In a first etching process, etching is carried out twice under first and second etching conditions. Although the etching conditions may be selected appropriately, etching is carried out by the following method in the present embodiment.

In the first etching process, ICP (Inductively Coupled Plasma) etching is used. As for the first etching condition, while using $CF_2$, $Cl_2$ and $O_2$ as an etching gas at the gas flow ratio of 17/17/10, an RF power (13.56 MHz) of 500 W is applied to a coiled electrode under a pressure of 1.5 Pa to generate plasma for etching. An RF power (13.56 MHz) of 120 W is applied also to a substrate side (sample stage) to apply a substantially negative self-bias voltage. The W film is etched under the first etching condition to make an edge portion of the first conductive film into a tapered shape.

Subsequently, etching is carried out under the second etching condition. Etching is performed for about 17 seconds with the mask left in such a way that an RF power (13.56 MHz) of 500 W is applied to the coil electrode under a pressure of 1.5 Pa to generate plasma for etching while using $CF_4$ and $Cl_2$ as an etching gas at the gas flow ratio of 20/20. An RF power (13.56 MHz) of 10 W is applied also to a substrate side (sample stage) to apply a substantially negative self-bias voltage. Under the second etching condition in which $CF_4$ and $Cl_2$ are mixed, both the W film and the TaN film are etched to the same extent. In the first etching process, edge portions of the first and second conductive film are made tapered due to the bias voltages applied to the substrate side.

Next, a second etching process is carried out without removing the mask. In the second etching process, etching is performed for about 25 seconds in such a way that, while using $SF_6$, $Cl_2$, and $O_2$ as an etching gas at the gas flow ratio of 16/8/30, an RF power (13.56 MHz) of 700 W is applied to the coil electrode under a pressure of 2.0 Pa to generate plasma. An RF power (13.56 MHz) of 0 W is applied also to a substrate side (sample stage) to apply a substantially negative self-bias voltage. The W film is selectively etched under this etching condition to form a conductive layer in a second shape. The first conductive film is hardly etched at this time. The gate electrode of the first conductive layer 207 and the second conductive layer 208, and the external connecting portion of the first conductive layer 209 and the second conductive layer 210 are formed by the first and second etching processes.

Then, a first doping process is carried out without removing the mask. Thus, the semiconductor layer 203 is doped with an n-type impurity at a low concentration. The first doping process may be performed by ion doping or ion implantation. The ion doping may be performed under conditions where the dose amount is from $1\times10^{13}$ to $5\times10^{14}$ atoms/cm$^2$ and the acceleration voltage is from 40 to 80 kV. In the present embodiment mode, the ion doping is carried out at an acceleration voltage of 50 kV. An element belonging to Group 15 of the periodic table may be used as the n-type impurity, and typically, phosphorus (P) or arsenic (As) is used. In the present embodiment mode, phosphorus (P) is used. In this case, a first impurity region (N$^-$ region) that is doped with a low-concentration impurity in a self-alignment manner is formed with the first conductive layer 207 as a mask.

Subsequently, the mask is removed. Then, a mask, for example, a resist mask is newly formed, and a second doping process is carried out at a higher acceleration voltage than that in the first doping process. Also in the second doping process, the semiconductor layer 203 is doped with an n-type impurity as well. The ion doping may be performed under conditions where the dose amount is from $1\times10^{13}$ to $3\times10^{15}$ atoms/cm$^2$ and the acceleration voltage is from 60 to 120 kV. In the present embodiment mode, the ion doping is carried out with the dose amount of $3.0\times10^{15}$ atoms/cm$^2$ and the acceleration voltage of 65 kV. In the second doping process, doping is carried out so that the semiconductor layer located under the first conductive layer 207 is also doped with the impurity element with the use of the second conductive layer 208 of the gate electrode as a mask against the impurity element. It is to be noted that the semiconductor layer 203 illustrated in FIG. 8B in the present embodiment mode is covered with the mask to operate as a p-type thin film transistor.

It is to be noted that although the respective impurity regions are formed by performing the two doping processes in the present embodiment mode, the present invention is not limited to this. An impurity region that has a desired impurity concentration may be formed by performing doping once or more times under appropriate conditions.

Next, after removing the mask, a mask, for example, a resist mask is newly formed to perform a third doping process. By the third doping process, a P$^+$ region 212 and P$^-$ region 211 are formed in the semiconductor layer 203 to serve as a p-channel TFT, which are doped with a p-type impurity element.

As the p-type impurity element, elements belonging to the group 13 of the periodic table, such as boron (B), aluminum (Al), and gallium (Ga), are known.

In the present embodiment mode, boron (B) is selected as the p-type impurity element, and the P$^+$ region 212 and the P$^-$ region 211 are formed by ion doping using diborane ($B_2H_6$). The ion doping is carried out under conditions where the dose amount is $1\times10^{16}$ atoms/cm$^2$ and the acceleration voltage is 80 kV.

It is to be noted that the semiconductor layer 203 forming N-channel TFT is covered with the mask in the third doping process.

It is to be noted that although the P$^+$ region 212 and the P$^-$ region 211 are formed by performing the third doping process once in the present embodiment mode, the present invention is not limited to this. P$^+$ region and a P$^-$ region may be formed by plural doping processes appropriately according to each condition.

In this way, a thin film transistor including the semiconductor layer, the gate insulating film, and the gate electrode is formed. It is to be noted that a method for manufacturing a thin film transistor is not limited to this, a thin film transistor may be manufactured appropriately by a known manufacturing method. Further, it is possible for users to determine the polarity of a TFT freely.

In the present embodiment, a top-gate thin film transistor using a crystalline silicon film crystallized by using laser crystallization is manufactured. However, a bottom-gate thin film transistor using an amorphous semiconductor film can be used for a pixel portion. Silicon germanium as well as silicon can be used for the amorphous semiconductor. In the case of using silicon germanium, it is preferable that the concentration of germanium be approximately 0.01 to 4.5 atomic %.

A microcrystalline semiconductor (semi-amorphous semiconductor) film, in which a crystal grain of 0.5 to 20 nm can be observed within an amorphous semiconductor, may be used. A microcrystal in which a crystal grain of 0.5 to 20 nm can be observed is also referred to as a microcrystal (μc).

Semi-amorphous silicon (also referred to as SAS) that is a semi-amorphous semiconductor can be obtained by glow discharge decomposition of a silicide gas. $SiH_4$ is used as a typical silicide gas. In addition, $Si_2H_6$, $SiH_2Cl_2$, $SiHCl_3$, $SiCl_4$, $SiF_4$, and the like can also be used as the silicide gas. SAS can be formed easily by diluting the silicide gas with hydrogen or with hydrogen and one or more rare gas elements selected from helium, argon, krypton, and neon. It is preferable to dilute the silicide gas so that the dilution ratio ranges from 10 to 1000 times. Reaction production of a film by glow discharge decomposition may be performed under a pressure in the range of 0.1 to 133 Pa. A high-frequency power of 1 to 120 MHz, preferably, 13 to 60 MHz may be supplied to generate glow discharge. It is preferable that the substrate heating temperature be preferably 300° C. or less, and a substrate heating temperature in the range of 100 to 250° C. is preferred.

The thus formed SAS has a Raman spectrum shifted to a lower frequency side than 520 cm$^{-1}$. In X-ray diffraction, diffraction peaks of (111) and (220) that are considered due to a crystal lattice of silicon are observed. The SAS contains hydrogen or halogen of at least 1 atomic % or more to terminate a dangling bond. It is desirable that an atmospheric-component impurity such as oxygen, nitrogen, or carbon is $1\times10^{20}$/cm$^3$ or less as an impurity element in the film, and particularly, the oxygen concentration is $5\times10^{19}$/cm$^3$ or less, preferably $1\times10^{19}$/cm$^3$ or less. When the SAS is used for a TFT, the mobility thereof is μ=1 cm$^2$/Vsec to 10 cm$^2$/Vsec.

In addition, this SAS may be further crystallized with a laser.

Figure 8C:
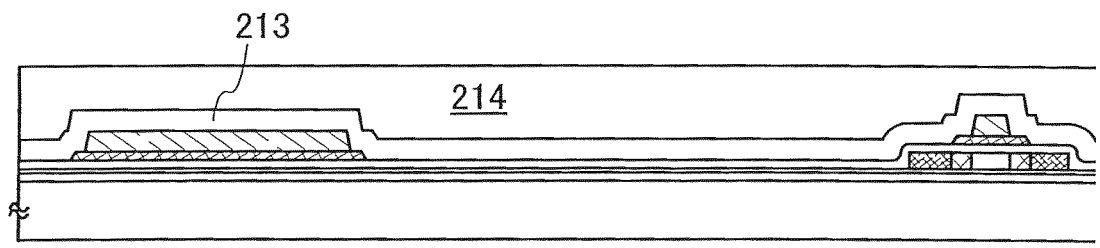

Subsequently, an insulating film (hydrogenation film) 213 is formed by using silicon nitride to cover the gate electrode of the first conductive layer 207 and the second conductive layer 208, the external connecting portion of the first conductive layer 209 and the second conductive layer 210, and the gate insulating film 204, and a heat treatment is performed at 480° C. for about an hour to activate the impurity elements and hydrogenate the semiconductor layer 203. Then, an interlayer insulating layer 214 is formed to cover the insulating film (hydrogenation film) 213 (FIG. 8C). As a material for forming the interlayer insulating layer 214, a self-flatness material such as acrylic, polyimide, or siloxane may be used. In the present embodiment mode, siloxane is formed as a first interlayer insulating layer.

Next, contact holes reaching the semiconductor layer 203 and the external connecting portion are formed. The contact holes can be formed by etching with the use of a mask, for example, a resist mask, until exposing the semiconductor layer 203 and the external connecting portion, and can be formed by either wet etching or dry etching. It is to be noted that etching may be performed once or divided into more than once according to the condition. When etching is performed more than once, both wet etching and dry etching may be used.

Figure 8D:
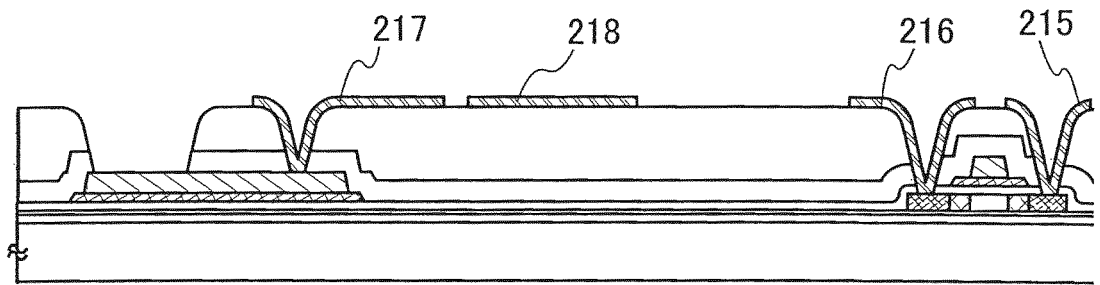

Then, a conductive layer is formed to cover the contact holes and the interlayer insulating layer. The conductive layer is processed into a predetermined shape with the use of a mask, for example, a resist mask, to form electrodes 215 and 216 to serve as a source electrode or a drain electrode and wirings 217 and 218 (FIG. 8D). These electrodes and wirings may be a single layer of aluminum, copper or the like. However, in the present embodiment mode, these electrodes and wirings have a laminated structure of molybdenum, aluminum, and molybdenum formed in this order. As a laminated wiring, a structure of titanium, aluminum, and titanium, and a structure of titanium, titanium nitride, aluminum, and titanium may be employed.

There is a gap between an inner edge of the wiring 217 and an outer edge of the wiring 218, the wiring 218 is formed closer to the light emitting element than the wiring 217, over the interlayer insulating layer 214. Further, it is desirable that the gap is 5 μm or more, preferably 10 μm or more, and more preferably 20 μm or more.

After forming a light-transmitting conductive layer that is partially overlapped with an exposed portion of the drain electrode 216, the light-transmitting conductive layer is processed with the use of a mask, for example, a resist mask, to form a lower electrode 220 for a thin film light-emitting element and an external connecting portion 221, where the lower electrode 220 is electrically connected to the drain electrode 216.

Further, in the present embodiment mode, the lower electrode 220 is formed as an anode, for which it is preferable to use a metal, an alloy, an electrically conductive compound, a mixture of these materials, or the like that has a larger work function (a work function of 4.0 eV or more). For example, gold (Au), platinum (Pt), nickel (Ni), tungsten (W), chromium (Cr), molybdenum (Mo), iron (Fe), cobalt (Co), copper (Cu), palladium (Pd), a nitride (TiN) of a metal material, and the like can be used in addition to ITO (indium tin oxide), ITO including silicon (ITSO), IZO (indium zinc oxide) of indium oxide mixed with 2 to 20% zinc oxide (ZnO), zinc oxide, and GZO (Gallium Zinc Oxide) of zinc oxide mixed with gallium. In the present embodiment, an ITSO is used for the lower electrode 220.

Figure 9A:
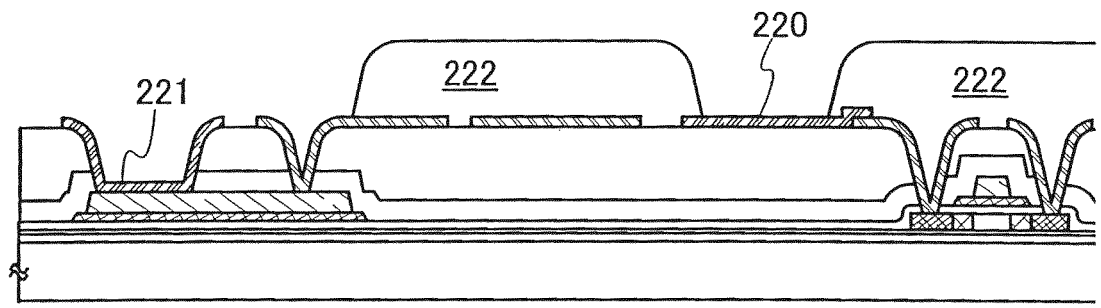
FIGS. 9A to 9C are diagrams illustrating the method for manufacturing a light-emitting device according to the present invention.

An insulating film including an organic material is formed to cover the interlayer insulating layer 214, the lower electrode 220, and wirings 217, 218. Subsequently, the insulating layer is processed so that a portion of the lower electrode 220 and the external connecting portion are exposed, and a partition 222 is thus formed (FIG. 9A). As a material for the partition 222, a photosensitive organic material (acrylic, polyimide, siloxane or the like) is preferably used. However, a non-photosensitive organic material may be used. Further, as a material of the partition 222, a black pigment or dye such as black titanium or carbon nitride may be dispersed with the use of a dispersant to make the partition 222 black like a black matrix. It is preferable that an edge side of the partition 222 toward the lower electrode 220 have a curvature and a tapered shape in which the curvature is continuously changing.

Figure 9B:
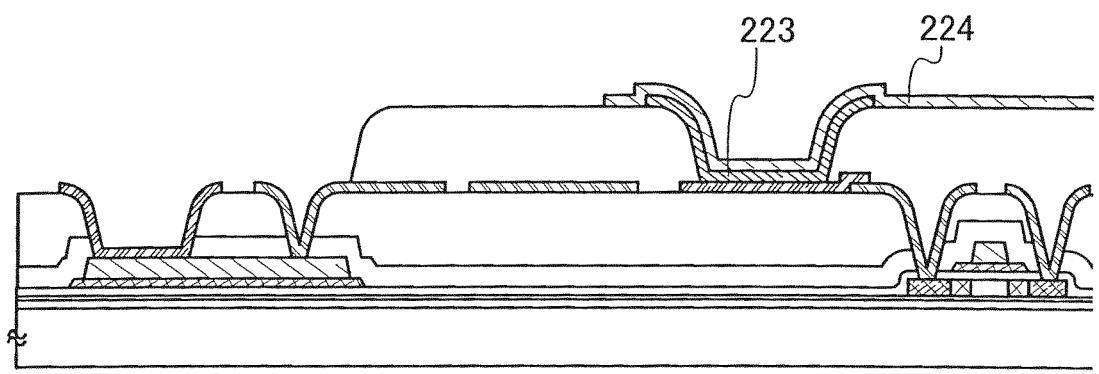

Next, a light-emitting laminated body 223 is formed to cover the lower electrode 220 exposed continuously from the partition 222. The light-emitting laminated body 223 may be formed by evaporation, spin coating, the ink-jet method or the like. Subsequently, an upper electrode 224 is formed to cover the light-emitting laminated body 223 (FIG. 9B). Therefore, a light-emitting element including the lower electrode 220, the light-emitting laminated body 223, and the upper electrode 224 can be manufactured. The upper electrode 224 is formed as a cathode in the present embodiment mode, and as a cathode material, it is preferable to use a metal, an alloy, an electrically conductive compound, a mixture of these materials, or the like that has a smaller work function (a work function of 3.8 eV or less). Specific examples of the cathode material include an element belonging to Group 1 or 2 of the periodic table, that is, alkali metals such as Li and Cs, alkali-earth metals such as Mg, Ca, and Sr, alloys (Mg:Ag and Al:Li), compounds (LiF, CsF, and CaF$_2$) each containing the element, and transition metals including rare-earth metals, which can be used for forming the cathode. However, the cathode can be formed by lamination of a metal (alloy is included) such as Al, Ag, or ITO. In the present embodiment mode, aluminum is used for the cathode.

It is to be noted that although the electrode electrically connected to the drain electrode 216 is the anode in the present embodiment mode, the cathode may be electrically connected to the drain electrode 216.

After that, a silicon oxide film containing nitrogen may be formed by plasma CVD as a passivation film by plasma CVD. In the case of using a silicon oxide film containing nitrogen, a silicon oxynitride film that is manufactured by using $SiH_4$, $N_2O$, and $NH_3$, a silicon oxynitride film that is manufactured by using $SiH_4$ and $N_2O$, or a silicon oxynitride film that is manufactured gas of $SiH_4$ and $N_2O$ diluted with Ar may be formed by plasma CVD.

Alternatively, a silicon oxynitride hydride film that is manufactured by using $SiH_4$, $N_2O$, and $H_2$ may be used as the passivation film. Naturally, the structure of the passivation film is not limited to a single layer structure. The passivation film may have a single layer structure or laminated structure using another insulating layer including silicon. In addition, a multilayer film of a carbon nitride film and a silicon nitride film, a multilayer film of a styrene polymer, a silicon nitride film, or a diamond like carbon film may be formed instead of the silicon oxide film containing nitrogen.

Forming the passivation film makes it possible to suppress penetration of elements that accelerate deterioration of the light-emitting element from the surface of the light-emitting element, which leads to improvement in reliability.

Figure 9C:
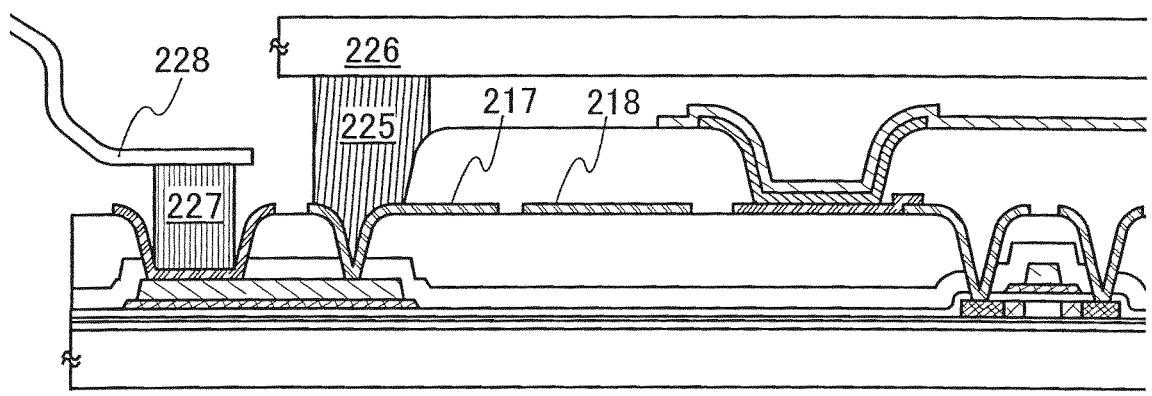

Subsequently, sealing of a display portion is performed to protect the light-emitting element from materials, such as water, that accelerate deterioration (FIG. 9C). In the case of using an opposed substrate 226 for sealing, a sealing material 225 comprising insulating material is used to attach the opposed substrate 226. There is a gap between an edge of the sealing material 225 and an edge of the upper electrode 224. The sealing material 225 is formed closer to an edge of the substrate 200 than an edge of the upper electrode 224.

At least a portion of the gap between the sealing material 225 and the upper electrode 224 is required to be formed to overlap with the gap between the wiring 217 and the wiring 218.

As shown in FIG. 9A, when the wiring 217 is formed from the outside of the sealing material 225 toward the inside of the sealing material 225, or from under the sealing material 225 toward the inside of the sealing material 225, penetration of water accelerated. Therefore, it is between the wiring 217 and the wiring 218 formed under the upper electrode 107 that the gap is necessary.

The space between the opposed substrate 226 and the element substrate may be filled with a inert gas such as dried nitrogen. It is preferable to use an ultraviolet curable resin or the like for the sealing material 225. The sealing material 225 may be mixed with a drying agent or particles for keeping a gap between the substrates constant.

After that, a light-emitting device according to the present invention is completed by attaching a flexible printed circuit (FPC) 228 to the external connecting portion 221 with an anisotropic conductive film 227 interposed therebetween.

In the present embodiment mode, the structure in Embodiment Mode 2 is applied. However, also when the structures in the other embodiment modes are applied, a light-emitting device where periphery deterioration can be suppressed can be manufactured.

In the thus manufactured light-emitting device, further penetration of water penetrating the light-emitting device through an organic film from the outside atmosphere of the light emitting device can be suppressed at a portion where the gaps explained above are formed. In addition, this makes it possible to suppress periphery deterioration of the light-emitting device.

Embodiment Mode 9

Figure 10:
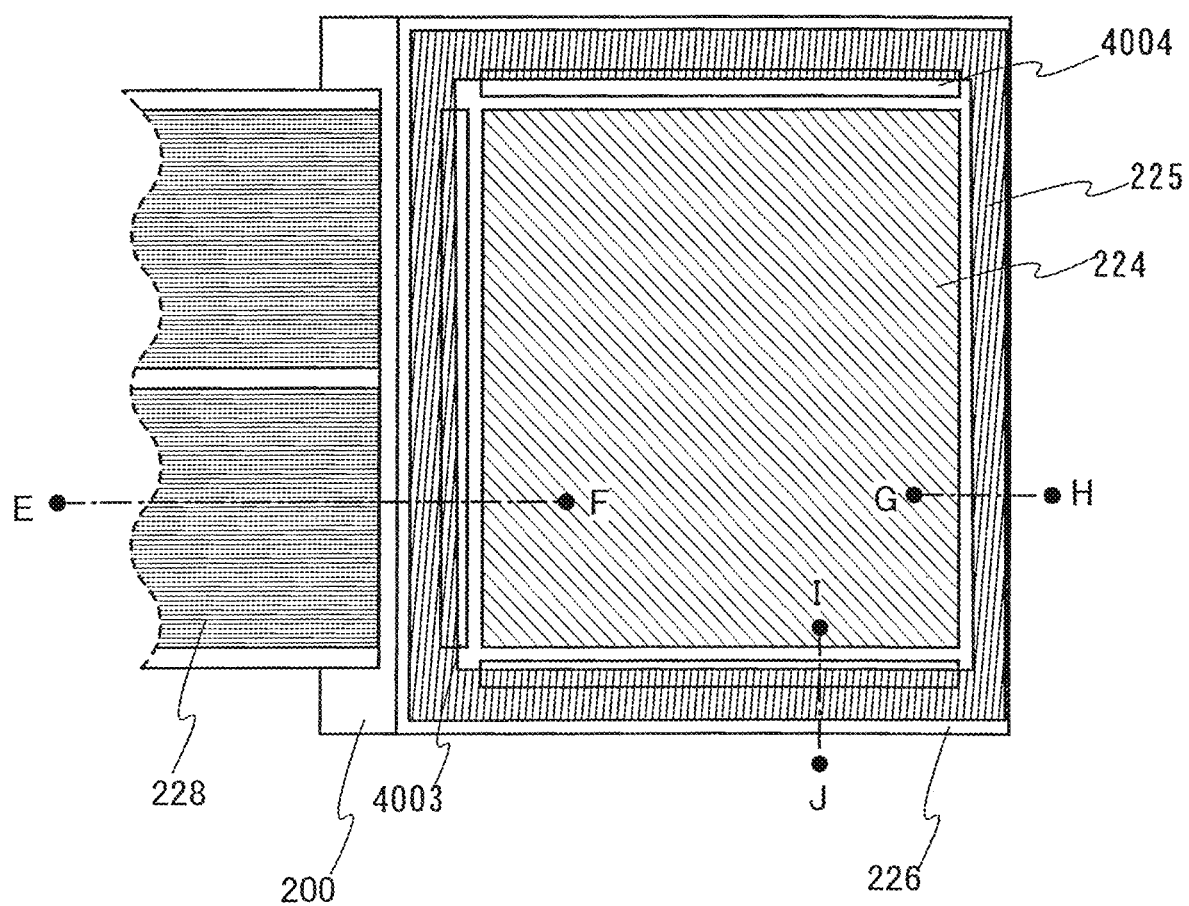
FIG. 10 is a top view of a light-emitting device according to the present invention.

The appearance of a panel in a light-emitting device manufactured in accordance with Embodiment Mode 8 will be described with reference to FIG. 10. It is to be noted that same reference numerals are used for the same portions as those in Embodiment Mode 8. FIG. 10 is a top view of a panel in which a transistor and a light-emitting element that are formed over the substrate 200 are sealed with a sealing material formed between a substrate 200 and an opposed substrate 226, and FIG. 9C corresponds to a cross-sectional view of FIG. 10 along E-F. Further, the cross-sectional views in FIGS. 1A, 1B, 2A, 3A, and 4A and FIGS. 5A to 7C correspond G-H or I-J in FIG. 10. As a matter of course, the structure according to the present invention can be applied to any portions at the periphery of the panel, and also can be applied to only a portion of a panel.

An upper electrode 224 for the light-emitting element is formed to cover a pixel portion in which the light-emitting element provided over the substrate 200 is formed, and a sealing material 225 is provided to surround a signal line driver circuit 4003 and a scan line driver circuit 4004. The opposed substrate 226 is provided over the pixel portion, the signal line driver circuit 4003, and the scan line driver circuit 4004. Thus, the pixel portion, the signal line driver circuit 4003, and the scan line driver circuit 4004 are sealed with the substrate 200, the sealing material 225, and the opposed substrate 226. An the sealing material 225 is formed closer to the edge of the substrate 200 than the edge of the upper electrode 224 for the light-emitting element, or formed so as to be overlapped with the edge of the upper electrode 224. The overlap is 15 µm or less. It is to be noted that, in the case of having the structure in Embodiment Mode 1 or 2, the upper electrode 224 and the sealing material 225 are not allowed to have contact with each other.

Further, the pixel portion, the signal line driver circuit 4003, and the scan line driver circuit 4004, which are provided over the substrate 200, have a plurality of thin film transistors. FIG. 9C shows a thin film transistor that is included in the pixel portion.

In addition, the light-emitting element is electrically connected to the thin film transistor.

A flexible printed circuit (FPC) 228 supplies a signal or a power supply voltage to the pixel portion, the signal line driver circuit 4003, and the scan line driver circuit 4004 through an external connecting portion 221 and a wiring 217.

It is to be noted that either an analog video signal or a digital video signal may be used in this light-emitting device that has a display function. In the case of using a digital video signal, the video signal is classified into a video signal using voltage or a video signal using current. When a light-emitting element emits light, a video signal that is input into a pixel is classified into a constant-voltage signal or a constant-current signal. When the video signal is a constant-voltage signal, the voltage applied to the light-emitting element or the current flowing in the light-emitting element is constant. On the other hand, when the video signal is a constant-current signal, the voltage applied to the light-emitting element or the current flowing in the light-emitting element is constant. The case in which the voltage applied to the light-emitting element is constant is referred to as a constant voltage driving while the case in which the current flowing in the light-emitting element is constant is referred to as constant current driving. In the constant current driving, a constant current flows regardless of change in the resistance of the light-emitting element. For the light-emitting device and driving method thereof, either a video signal using voltage or a video signal using current may be used, and either constant voltage driving or constant current driving may be employed.

It is to be noted that the light-emitting device according to the present invention includes, in its category, a panel in which a pixel portion including a light-emitting element is formed and a module in which an IC is mounted on the panel.

In a panel and a module as described in the present embodiment mode, further penetration of water penetrating through an organic film from the outside atmosphere of the light emitting device can be suppressed by providing a gap between the wirings 217 and 218 and a gap between the sealing member 225 and the upper electrode 224. In addition, this makes it possible to suppress periphery deterioration of a light-emitting device.

Embodiment Mode 10

Electronic devices mounted with a module according to the present invention, as shown in FIGS. 11A to 11E as examples, include a video camera, a digital camera, a goggle-type display (head mount display), a navigation system, a sound reproduction device (a car audio component or the like), a laptop personal computer, a game machine, a personal digital assistance (a mobile computer, a cellular phone, a portable game machine, an electronic book, or the like), and an image reproduction device equipped with a recording medium (specifically, a device equipped with a display, which can reproduce a recording medium such as a Digital Versatile Disc (DVD) and display the image). Specific examples of these electronic devices are shown in FIGS. 11A to 11E.

Figure 11A:
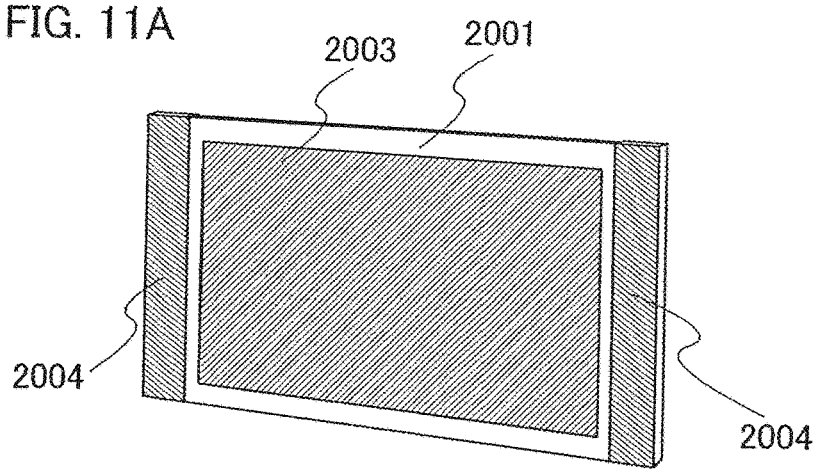
FIGS. 11A to 11E are diagrams showing examples of electronic devices according to the present invention.

FIG. 11A is a light-emitting device, to which a television set or the like corresponds. A frame body 2001, a display portion 2003, a speaker portion 2004, and the like are included. In the light-emitting display device, deterioration of a light-emitting element in the display portion 2003 is suppressed, and the reliability is improved. A pixel portion may be provided with a polarizing plate or a circularly polarizing plate in order to enhance the contrast. For example, films of a ¼λ, plate, a ½λ, plate, and a polarizing plate may be sequentially formed over a sealing substrate. Further, an anti-reflective film may be provided over the polarizing plate.

Figure 11B:
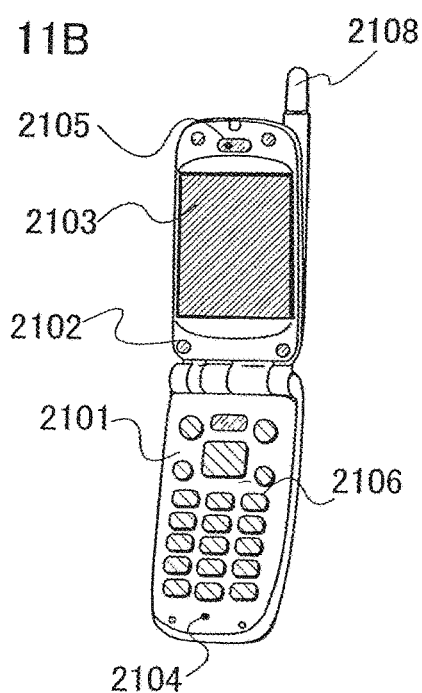

FIG. 11B is a cellular phone, which includes a main body 2101, a frame body 2102, a display portion 2103, a voice input portion 2104, a voice output portion 2105, an operation key 2106, an antenna 2108, and the like. In the cellular phone according to the present invention, deterioration of a light-emitting element in the display portion 2103 is suppressed, and the reliability is improved.

Figure 11C:
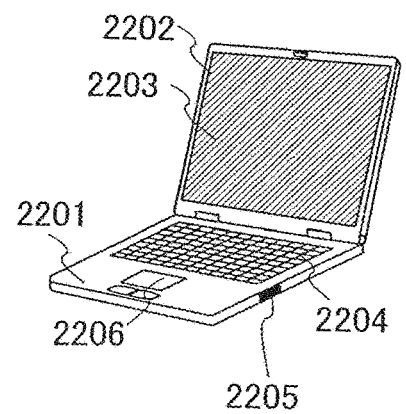

FIG. 11C is a laptop computer, which includes a main body 2201, a frame body 2202, a display portion 2203, a keyboard 2204, an external connection port 2205, a pointing mouse 2206, and the like. In the laptop personal computer according to the present invention, deterioration of a light-emitting element in the display portion 2203 is suppressed, and the reliability is improved.

Figure 11D:
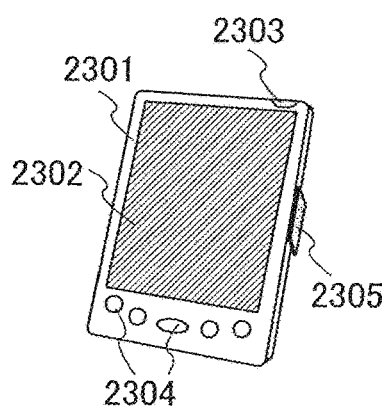

FIG. 11D is a mobile computer, which includes a main body 2301, a display portion 2302, a switch 2303, an operation key 2304, an infrared port 2305, and the like. In the mobile computer according to the present invention, deterioration of a light-emitting element in the display portion 2302 is suppressed, and the reliability is improved.

Figure 11E:
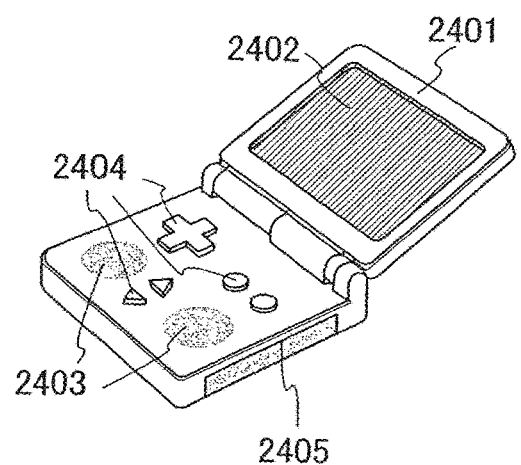

FIG. 11E is a portable game machine, which includes a frame body 2401, a display portion 2402, a speaker portion 2403, operation keys 2404, a recording medium insert portion 2405, and the like. In the portable game machine according to the present invention, deterioration of a light-emitting element in the display portion 2402 is suppressed, and the reliability is improved.

As described above, the present invention is capable of quite wide application, and can be thus used for electronic devices in all fields.

Embodiment Mode 11

In this present embodiment mode, the structure of the light-emitting laminated body will be described in detail.

The light-emitting laminated body is formed by using a charge injecting/transporting material including an organic compound or inorganic compound and a luminescent material. The light-emitting laminated body includes one or more of layers each including a low molecular weight organic compound, an intermediate molecular weight organic compound (referring to an organic compound which has no sublimation property and has 20 molecules or less or a chained molecule of 10 μm or less in length), or a high molecular weight organic compound, and may be combined with an electron injecting/transporting or hole injecting/transporting inorganic compound.

Highly electron transporting materials among charge injecting/transporting materials include a metal complex that has a quinoline skeleton or a benzoquinoline skeleton, such as tris(8-quinolinolato)aluminum (abbreviation: Alq$_3$), tris(5-methyl-8-quinolinolato)aluminum (abbreviation: Almq$_3$), bis(10-hydroxybenzo[h]-quinolinato)beryllium (abbreviation: BeBq$_2$), and bis(2-methyl-8-quinolinolato)-4-phenylphenolato-aluminum (abbreviation: BAlq). In addition, highly hole transporting materials include an aromatic amine compound (that is, a compound that has a benzene ring-nitrogen bond), such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4''-tris(N,N-diphenyl-amino)-triphenylamine (abbreviation: TDATA), and 4,4',4''-tris[N-(3-methylphenyl)-N-phenyl-amino]-triphenylamine (abbreviation: MTDATA).

Further, highly electron injecting materials among charge injecting/transporting materials include a compound of an alkali metal or an alkali-earth metal, such as lithium fluoride (LiF), cesium fluoride (CsF), and calcium fluoride (CaF$_2$). In addition, a mixture of a highly electron transporting material such as Alq$_3$ and an alkali-earth metal such as magnesium (Mg) may be used.

Highly hole injecting material among charge injecting/transporting materials include metal oxides such as molybdenum oxide (MoOx), vanadium oxide (VOx), ruthenium oxide (RuOx), tungsten oxide (WOx), and manganese oxide (MnOx), and further, phthalocyanine compounds such as phthalocyanine (abbreviation: H$_2$Pc) and copper phthalocyanine (CuPc).

The light-emitting layer included in the light-emitting laminated body may have a structure in which a light-emitting layer that shows a different emission wavelength band is formed on a pixel to pixel basis for color display. Typically, a light-emitting layer corresponding to each color of R (red), G (green), and B (blue) is formed. Also in this case, a filter through which light of the emission wavelength band is transmitted is provided on the side to which light is emitted in a pixel so that the color purity can be improved and that the pixel portion can be prevented from being like a mirror surface (reflecting). When the filter (coloring layer) is provided, a circular polarization plate to be required conventionally and the like can be omitted so that loss of light emitted from the light-emitting layer can be eliminated.

Further, variations in color tone can be reduced in the case of viewing the pixel portion (display screen) obliquely.

Luminescent materials include various materials. Among low molecular weight organic luminescent materials, 4-dicyanomethylene-2-methyl-6-(1,1,7,7-tetramethyl julolidyl-9-ethenyl)-4H-pyran (abbreviation: DCJT), 4-dicyanomethylene-2-t-butyl-6-(1,1,7,7-tetramethyljulolidine-9-enyl]-4H-pyran (abbreviation: DPA), periflanthene, 2,5-dicyano-1,4-bis(10-methoxy-1,1,7,7-tetramethyl julolidine-9-enyl) benzene, N,N'-dimethyl quinacridon (abbreviation: DMQd), coumarin 6, coumarin 545T, tris(8-quinolinolate)aluminum (abbreviation: $Alq_3$), 9,9'-bianthryl, 9,10-di phenylanthracene (abbreviation: DPA), 9,10-bis(2-naphthyl)anthracene (abbreviation: DNA), and the like can be used. In addition, another material can also be used.

On the other hand, high molecular weight organic luminescent materials are physically stronger than low molecular weight materials, and have higher durability in light-emitting elements. In addition, since high molecular weight materials can be deposited by coating, light-emitting elements are relatively easily manufactured. The structure of a light-emitting element using a high molecular weight organic luminescent material is basically the same as that of a light-emitting element using a low molecular weight organic luminescent material, which is a laminated structure of a cathode, a light-emitting laminated body, and an anode. However, it is difficult to form such a laminated structure as in the case of using a low molecular weight organic luminescent material when a light-emitting laminated body using a high molecular weight organic luminescent material is formed. Therefore, a two-layer structure is employed in many cases. Specifically, a laminated structure of a cathode, a light-emitting layer, a hole transporting layer, and an anode is employed.

The luminescent color is determined by the material forming a light-emitting layer of the light-emitting laminated body. Therefore, a light-emitting element that emits desired light can be formed by selecting an appropriate material for the light-emitting laminated body. High molecular weight electroluminescent material that can be used to form the light-emitting layer include polyparaphenylenevinylene materials, polyparaphenylene materials, polythiophen materials, and polyfluorene materials.

The polyparaphenylenevinylene materials include derivatives of poly(paraphenylene vinylene) [PPV], poly(2,5-dialkoxy-1,4-phenylene vinylene) [RO-PPV], poly(2-(2'-ethyl-hexoxy)-5-metoxy-1,4-phenylene vinylene) [MEH-PPV], and poly(2-(dialkoxyphenyl)-1,4-phenylene vinylene) [ROPh-PPV]. The polyparaphenylene materials include derivatives of polyparaphenylene [PPP], poly(2,5-dialkoxy-1,4-phenylene) [RO-PPP] and poly(2,5-dihexoxy-1,4-phenylene). The polythiophene materials include derivatives of polythiophene [PT], poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], and poly [3-(4-octylphenyl)-2,2 bithiophene] [PTOPT]. The polyfluorene materials include derivatives of polyfluorene [PF], poly(9, 9-dialkylfluorene) [PDAF] and poly(9,9-dioctylfluorene) [PDOF].

Further, a high molecular weight organic luminescent material having hole-transporting property is formed to be interposed between an anode and a high molecular weight organic luminescent material, the hole injection property from the anode can be enhanced. This high molecular weight organic luminescent material having hole-transporting property is generally dissolved into water together with an acceptor material, and the solution is applied by spin coating or the like. Since the hole transporting material is insoluble in an organic solvent, the high molecular weight organic luminescent material having hole-transporting property and the organic luminescent material described above can be laminated. The high molecular weight organic luminescent materials having hole-transporting property includes a mixture of PEDOT and camphorsulfonic acid (CSA) that serves as an acceptor material, a mixture of polyaniline [PANI] and polystyrene sulfonic acid [PSS] that serves as an acceptor material, and the like.

In addition, the light-emitting layer can be formed to emit monochromatic or white light. In the case of using a white luminescent material, it makes color display possible to provide a filter (coloring layer) through which light of a specific wavelength is transmitted on the side to which light is emitted in a pixel.

In order to form a light-emitting layer that emits white light, for example, $Alq_3$, $Alq_3$ partially doped with Nile red that is a red luminescent dye, $Alq_3$, p-EtTAZ, and TPD (aromatic diamine) are sequentially laminated by evaporation so that white light can be obtained. When a light emitting layer is formed by an application method using spin coating, it is preferable after the application to perform baking by vacuum heating. For example, an aqueous solution of poly(ethylene dioxythiophene)/poly(styrene sulfonic acid) (PEDOT/PSS) may be entirely applied and baked to act as a hole injecting layer, and then, a polyvinyl carbazole (PVK) solution doped with a luminescent center dye (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) may be entirely applied and baked to act as a light-emitting layer.

The light-emitting laminated body can be formed to be a single layer. For example, an electron transporting 1,3,4-oxadiazole derivative (PBD) may be dispersed in a hole transporting polyvinyl carbazole (PVK). In addition, white light emission can be obtained by dispersing 30 wt % PBD as an electron transporting agent and appropriately dispersing four dyes (TPB, coumarin 6, DCM1, and Nile red). In addition to the light-emitting elements described here, which provide white light emission, a light-emitting element that provides red light emission, green light emission, or blue light emission can be manufactured by selecting the material for the light-emitting layer appropriately.

Further, a high molecular weight organic luminescent material having hole-transporting property is formed to be interposed between an anode and a high molecular weight organic luminescent material, the hole injection property from the anode can be enhanced. This high molecular weight organic luminescent material having hole-transporting property is generally dissolved into water together with an acceptor material, and the solution is applied by spin coating or the like. Since the hole transporting material is insoluble in an organic solvent, the high molecular weight organic luminescent material having hole-transporting property and the organic luminescent material described above can be laminated. The high molecular weight organic luminescent materials having hole-transporting property includes a mixture of PEDOT and camphorsulfonic acid (CSA) that serves as an acceptor material, a mixture of polyaniline [PANI] and polystyrene sulfonic acid [PSS] that serves as an acceptor material, and the like.

For the light-emitting layer, triplet-excitation luminescent materials such as metal complexes may be used in addition to singlet-excitation luminescent materials. For example, of a red light-emitting pixel, a green light-emitting pixel, and a blue light-emitting pixel, the red light-emitting pixel, which produces a luminance with a relatively short half life in, is formed with the use of a triplet-excitation luminescent material while the others are formed with the use of singlet-excitation luminescent materials. Since triplet-excitation luminescent materials are excellent in luminous efficiency, it is a feature that lower power consumption is necessary to obtain the same luminance. Namely, when a triplet-excitation luminescent material is applied to the red pixel, the necessary amount of the current applied to a light-emitting element is lower so that the reliability can be improved. In order to lower power consumption, the red light-emitting pixel and the green light-emitting pixel may be formed with the use of triplet-excitation luminescent materials while the blue light-emitting pixel is formed with the use of a singlet-excitation luminescent material. Also as for a green light-emitting element for which people have higher visibility acuity, the power consumption can be lowered by forming the green light-emitting element with the use of a triplet-excitation luminescent material.

As an example of the triplet excitation light-emitting material, there is a material using a metal complex as a dopant, and for example, a metal complex having platinum that is a third transition series element as a central metal and a metal complex having iridium as a central metal are known. The triplet-excitation luminescent material is not limited to these compounds, and a compound that has the structure described above and an element belonging to one of Groups 8 to 10 of the periodic table as a central metal can also be used.

The above-described materials for forming a light-emitting layer are just example. A light-emitting element can be formed by appropriately stacking respective functional layers such as a hole injecting layer, a hole transporting layer, an electron injecting layer, an electron transporting layer, a light-emitting layer, an electron blocking layer, and a hole blocking layer. Alternatively, a mixed layer or mixed junction in which some of these respective layers are combined may be formed. The structure of the light-emitting laminated body can be changed, and modifications can be permitted unless such changes and modifications depart from the scope of the present invention. For example, instead of providing a specific electron injecting region or light-emitting region, an electrode can be provided mainly for this purpose, and a luminescent material can be provided by dispersing the luminescent material.

When the light-emitting element is biased in a forward direction, light is emitted. Pixels of a display device formed with the use of the light-emitting element can be driven by a simple matrix method or an active matrix method. In any case, a forward bias is applied to each pixel at a specific time to emit light while the pixel is in a non-emitting state for a certain period. When the reverse bias is applied for this non-emitting time, the reliability of the light-emitting element can be improved. In a light-emitting element, deterioration occurs, in which emission intensity is decreased under specific driving conditions or a non-light-emitting region is enlarged in a pixel to decrease luminance apparently. However, progression of deterioration can be made slower by alternating driving in which a forward bias and a reverse bias are applied, and. the reliability of a light-emitting device can be thus improved.

Embodiment 1

Figure 12B:
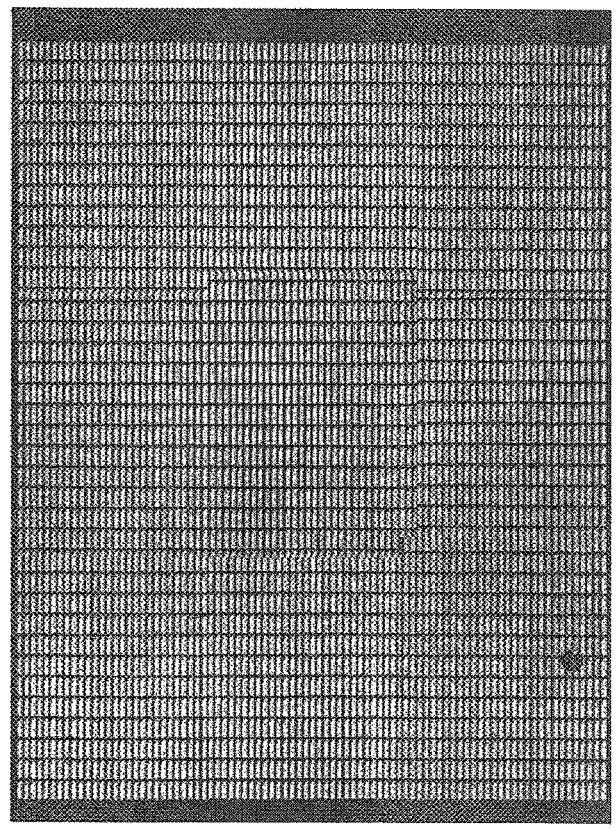
FIGS. 12A and 12B are experimental results relating to a light-emitting device that has the structure in Embodiment Mode 1.
Figure 12A:
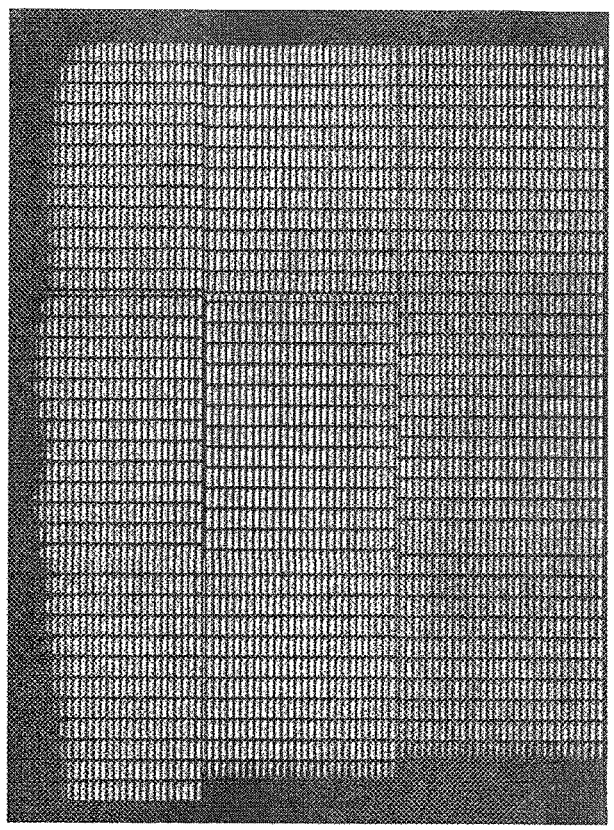

FIG. 12A shown as Example 1 shows an emitting state photographed after preserving a light-emitting device according to the present invention, which has the structure shown in FIG. 1A and a desiccant provided at the opposed substrate 109, for 180 hours under conditions where the room temperature is 65° C. and the humidity is 95%. In addition, for FIG. 12B shown as Comparative Example 1, although almost the same structure as the structure for FIG. 12A is employed, there is a difference in that the wiring 103 in FIG. 1A extends under the upper electrode 107 for the light-emitting element.

In FIGS. 12A and 12B, each of patterns arranged in a matrix represents a pixel emitting light, and a pixel emitting no light is photographed in black. The photographs are taken without being irradiated with light while keeping all of the pixels driven to emit light.

It is determined that periphery deterioration progresses with disarray of the patterns of the pixels in a periphery portion in FIG. 12B where the wiring 103 extends under the upper electrode 107 for the light-emitting element while no periphery deterioration occurs without disarray of the patterns in FIG. 12A to which the present invention is applied. Thus, the utility of the present invention is recognized.

It is to be noted that glass substrates are used as the substrate 100 and the opposed substrate 109, a silicon nitride film containing oxygen is used as the base insulating film 101, acrylic is used for the first and second organic insulating films 102 and 105, a laminated body of Ti, Al—Si, and Al is used as the wiring 103, and a ultraviolet curable epoxy resin is used for the sealing material 108 in the example and the comparative example.

In addition, the whole of the light-emitting device is not photographed, but a portion that has the structure according to the present invention is selected while centering on the substrate edge, enlarged, and then photographed for the pictures in FIGS. 12A and 12B. However, the positions photographed in Embodiment 1 and Comparative Example 1 are approximately conformed to each other.

Embodiment 2

FIGS. 13A to 13C shown as Example 2 show emitting states photographed after light-emitting devices according to the present invention, which have the structure shown in FIG. 1B and a desiccant provided at the opposed substrate 109, are preserved for 200 hours under conditions where the room temperature is 65° C. and the humidity is 95%. In FIGS. 13A to 13C, there are respectively gaps (corresponding to the gap b in FIG. 1B) of 200 μm, 50 μm, and 20 μm between the wirings 103a and 103b, and the wiring 103b extends to under the upper electrode 107 for the light-emitting element. FIG. 13D that is Comparative Example 2 has a structure in which the gap between the wiring 103a and 103b is 0 μm, that is, a structure without the gap or a structure in which the wiring 103a extends under the upper electrode 107.

In FIGS. 13A to 13D, each of patterns arranged in a matrix represents a pixel emitting light, and each of the photographs arranged at the upper column in the figures is a photograph taken by irradiating a sample with light and observing light reflected at the sample while each of the photographs arranged at the lower column in the figures is a photograph taken without being irradiated with light. The shapes of the wirings can be confirmed in the photographs at the upper column, and the pixels emitting light can be confirmed in the photographs at the lower column since the pixels emitting no light are photographed in black. It is to be noted that the upper and lower photographs in each of FIGS.

13A to 13D have the same position photographed and that each of the photographs is taken while keeping all of the pixels driven to emit light.

The result is that loss of light emission due to deterioration is not recognized in the structure of each of FIGS. 13A to 13C, where the gap is provided between the wirings 103a and 103b as described above, while periphery deterioration progresses so much under the same conditions that there is no lighted pixel in the observed area in Comparative Example 2. Thus, the utility of the present invention is recognized. It is to be noted that it is preferable that the gaps are the 1 µm or more, preferably 10 or more, and more preferably 20 µm or more.

It is to be noted that glass substrates are used as the substrate 100 and the opposed substrate 109, a silicon nitride film containing oxygen is used as the base insulating film 101, acrylic is used for the first and second organic insulating films 102 and 105, a laminated body of Ti, Al—Si, and Al is used as the wiring 103, and a ultraviolet curable epoxy resin is used for the sealing material 108 in the example and the comparative example.

Embodiment 3

FIGS. 14A and 14B shown as Example 3 show emitting states photographed after light-emitting devices according to the present invention, which have the structure shown in FIGS. 2A to 2C and a desiccant provided at the opposed substrate 109, are preserved for 84 hours under conditions where the room temperature is 65° C. and the humidity is 95%. In FIG. 14A, a wiring (corresponding to the wiring 103 in FIG. 2C) that has a width (corresponding to the width c in FIG. 2C) of 5 µm and a wiring that has a width of 20 µm can be observed, and a wiring that has a width of 100 µm can be observed in FIG. 14B.

In FIGS. 14A to 14E, each of patterns arranged in a matrix represents a pixel emitting light, and each of the photographs arranged at the upper column in the figures is a photograph taken by irradiating a sample with light and observing light reflected at the sample while each of the photographs arranged at the lower column in the figures is a photograph taken without being irradiated with light. The shapes of the wirings can be confirmed in the photographs at the upper column, and the pixels emitting light can be confirmed in the photographs at the lower column since the pixels emitting no light are photographed in black. It is to be noted that the upper and lower photographs in each of FIGS. 13A to 13D have the same position photographed and that each of the photographs is taken light while keeping all of the pixels driven to emit light.

In FIGS. 14C to 14E shown as Comparative Example 3, wirings that have widths of 1 mm, 5 mm, and 10 mm are formed respectively. It is to be noted that only pixels appear in the photographs in FIGS. 14D and 14E because the wiring with the width of 5 mm or more is too large to be included in the photograph. The result is that no deterioration occurs in FIGS. 14A and 14B with the width of the wiring: 5 µm, 20 µm, and 100 µm with the structure according to the present invention while deterioration occurs since the width of the wiring is increased in Comparative Example 3 (the width of the wiring: 1 mm, 5 mm, and 10 mm). Thus, the utility of the present invention is recognized.

It is to be noted that glass substrates are used as the substrate 100 and the opposed substrate 109, a silicon nitride film containing oxygen is used as the base insulating film 101, acrylic is used for the first and second organic insulating films 102 and 105, a laminated layer of Ti, Al—Si, and Al is used as the wiring 103, and a ultraviolet curable epoxy resin is used for the sealing material 108 in the example and the comparative example.

Embodiment 4

FIGS. 15A to 15D shown as Example 4 show emitting states photographed after preserving light-emitting devices according to the present invention, which have the structure shown in FIGS. 3A to 3C and a desiccant provided at the opposed substrate 109, for 200 hours under conditions where the room temperature is 65° C. and the humidity is 95%. In FIGS. 15A to 15D, wirings (corresponding to the wirings 103 in FIG. 3C) that have a width (corresponding to the width c in FIG. 3C) of 30 µm are arranged apart from each other, where the distances (corresponding to the distance d in FIG. 3C) between the wirings are respectively 20 µm, 15 µm, 10 µm, and 5 µm.

In FIGS. 15A to 15D, each of patterns arranged in a matrix represents a pixel emitting light, and each of the photographs arranged at the upper column in the figures is a photograph taken by irradiating a sample with light and observing light reflected at the sample while each of the photographs arranged at the lower column in the FIGS. is a photograph taken without being irradiated with light. The shapes of the wirings can be confirmed in the photographs at the upper column, and the pixels emitting light can be confirmed in the photographs at the lower column since the pixels emitting no light are photographed in black. It is to be noted that the upper and lower photographs in each of FIGS. 13A to 13D have the same position photographed and that each of the photographs is taken light while keeping all of the pixels driven to emit light.

A comparative example in which the distance is 0 µm corresponds to Comparative Example 2 shown in Embodiment 2. The result is that no deterioration occurs in Embodiment 4 with the structure shown in FIGS. 3A to 3C while deterioration occurs after a preservation test for the same hours under the same conditions in Comparative Example 2. Thus, the utility of the present invention is recognized.

It is to be noted that glass substrates are used as the substrate 100 and the opposed substrate 109, a silicon nitride film containing oxygen is used as the base insulating film 101, acrylic is used for the first and second organic insulating films 102 and 105, a laminated layer of Ti, Al—Si, and Al is used as the wiring 103, and a ultraviolet curable epoxy resin is used for the sealing material 108 in the example and the comparative example.

Embodiment 5

Figure 16A:
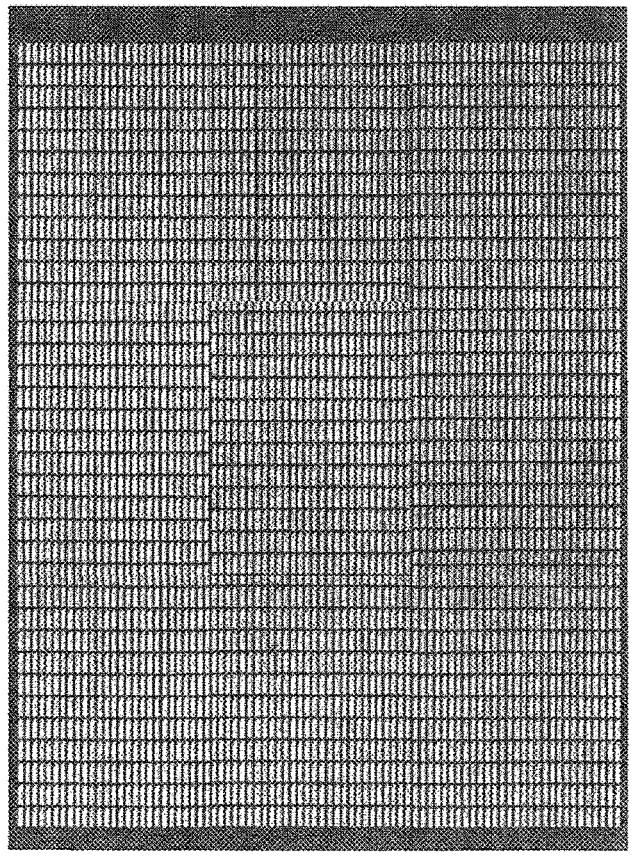
FIGS. 16A and 16B are experimental results relating to a light-emitting device that has the structures in Embodiment Modes 2 and 5.

FIG. 16A shown as Example 5 shows an emitting state of a light-emitting device according to the present invention, which has the structure shown in FIG. 1B at a top portion, a left portion, and a bottom portion in the photograph and has a structure that is similar to the structure shown in FIGS. 4A to 4C at a right portion in the photograph, and photographed after the light emitting device is preserved for 30 hours under conditions where the room temperature is 65° C. and the humidity is 95%. Further, a desiccant is provided at the opposed substrate 109.

Figure 17:
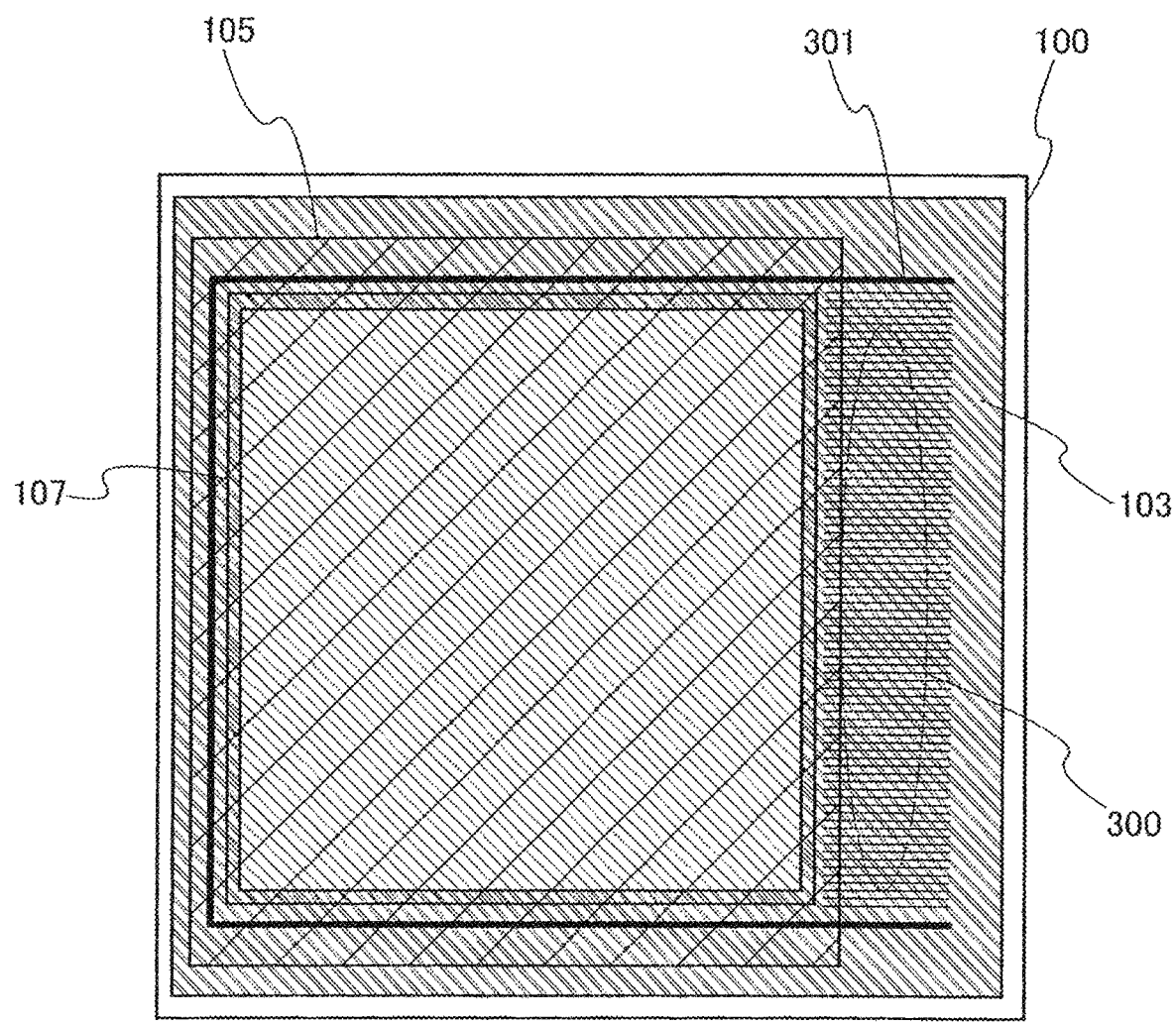
FIG. 17 is a schematic view of the light-emitting device that has the structures in Embodiment Modes 2 and 5.

FIG. 17 shows a schematic view showing a wiring pattern, a sealing pattern, an electrode pattern for a light-emitting element, and the like in the light emitting device of FIG. 16A. Reference numeral 301 corresponds to a gap of 20 µm, and reference numeral 300 denotes a structure in which a plurality of openings that have shorter side of approximately 5 mm are arranged approximately 100 mm apart from each other to be adjacent to each other in the narrower-side direction of the opening.

Figure 16B:
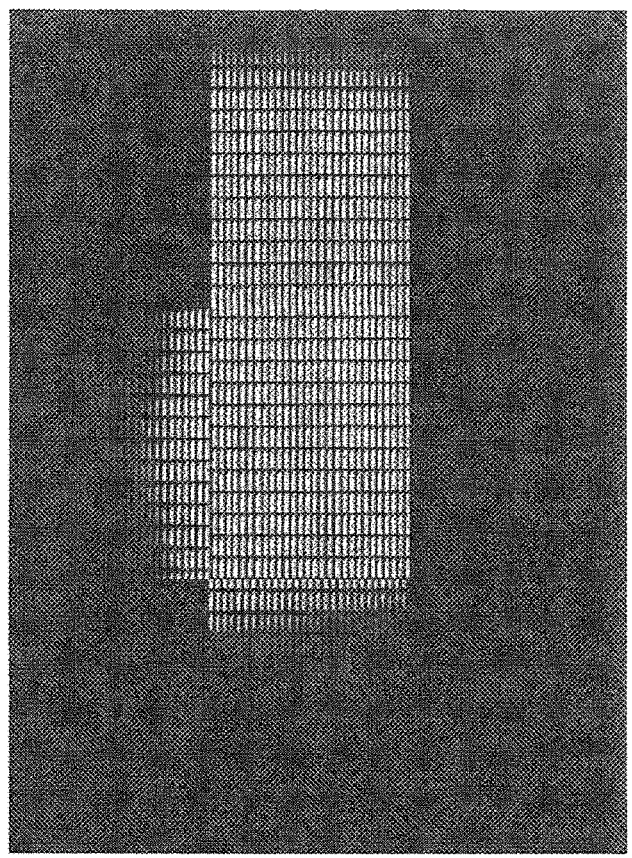

In addition, FIG. 16B shown as Comparative Example 5 is a photograph after preserving a light-emitting device to which the measure described above is not applied for the same hours under the same conditions. Each of patterns arranged in a matrix represents a pixel emitting light, and a pixel emitting no light is photographed in black. The photographs are taken without being irradiated with light while keeping all of the pixels driven to emit light.

The result is that periphery deterioration progresses in FIG. 16B to which the present invention is not applied while no periphery deterioration occurs in FIG. 16A to which the present invention is applied. Thus, the utility of the present invention is recognized.

It is to be noted that glass substrates are used as the substrate 100 and the opposed substrate 109, a silicon nitride film containing oxygen is used as the base insulating film 101, siloxane is used for the first organic insulating film 102, polyimide is used for the second organic insulating film 105, a laminated layer of Ti, Al—Si, and Al is used as the wiring 103, and a ultraviolet curable epoxy resin is used for the sealing material 108 in the present embodiment and comparative example.

In addition, the whole of the light-emitting device is not photographed, but a portion that has the structure according to the present invention is selected while centering on the substrate edge, enlarged, and then photographed for the pictures in FIGS. 12A and 12B. However, the positions photographed in Embodiment 1 and Comparative Example 1 are approximately conformed to each other.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

What is claimed is:

1. A light-emitting device comprising:
a first organic insulating layer over a substrate;
a conductive layer over and in contact with the first organic insulating layer;
an anode over the first organic insulating layer;
a second organic insulating layer over the conductive layer and the anode;
a layer containing a light-emitting material over the second organic insulating layer;
a cathode over the layer containing a light-emitting material; and
a sealing material comprising an organic material,
wherein the first organic insulating layer comprises an opening,
wherein the sealing material overlaps the opening,
wherein a region of the conductive layer is in the opening,
wherein the cathode overlaps the conductive layer with the second organic insulating layer therebetween,
wherein the layer containing a light-emitting material overlaps the conductive layer with the second organic insulating layer therebetween,
wherein the second organic insulating layer does not overlap a region of the conductive layer,
wherein the conductive layer comprises a region having a plurality of openings, and
wherein the cathode does not overlap the region having the plurality of openings of the conductive layer.

2. The light-emitting device according to claim 1, wherein the conductive layer and the anode are spaced from each other.

3. The light-emitting device according to claim 1, wherein the cathode overlaps a gap between the conductive layer and the anode.

4. The light-emitting device according to claim 1, wherein the cathode comprises a region which does not overlap the layer containing a light-emitting material.

5. A light-emitting device comprising:
a first organic insulating layer over a substrate;
a conductive layer over and in contact with the first organic insulating layer;
an anode over the first organic insulating layer;
a second organic insulating layer over the conductive layer and the anode;
a layer containing a light-emitting material over the second organic insulating layer;
a cathode over the layer containing a light-emitting material; and
a sealing material comprising an organic material,
wherein the first organic insulating layer comprises an opening,
wherein the sealing material overlaps the opening,
wherein a region of the conductive layer is in the opening,
wherein the conductive layer comprises a plurality of openings,
wherein the cathode overlaps the conductive layer with the second organic insulating layer therebetween,
wherein the layer containing a light-emitting material overlaps the conductive layer with the second organic insulating layer therebetween,
wherein the second organic insulating layer does not overlap the region of the conductive layer, and
wherein the cathode does not overlap the plurality of openings.

6. The light-emitting device according to claim 5, wherein the conductive layer and the anode are spaced from each other.

7. The light-emitting device according to claim 5, wherein the cathode overlaps a gap between the conductive layer and the anode.

8. The light-emitting device according to claim 5, wherein the cathode comprises a region which does not overlap the layer containing a light-emitting material.

9. A light-emitting device comprising:
a first organic insulating layer over a substrate;
a conductive layer over the first organic insulating layer;
an anode over the first organic insulating layer;
a second organic insulating layer over the conductive layer and the anode;
a layer containing a light-emitting material over the second organic insulating layer;
a cathode over the layer containing a light-emitting material; and
a sealing material comprising an organic material,
wherein the first organic insulating layer comprises an opening,
wherein the sealing material overlaps the opening,
wherein a region of the conductive layer is in the opening,
wherein the conductive layer comprises a plurality of openings including a first opening and a second opening,
wherein the cathode overlaps the conductive layer with the second organic insulating layer therebetween, wherein the layer containing a light-emitting material overlaps the conductive layer with the second organic insulating layer therebetween, wherein the second organic insulating layer does not overlap the region of the conductive layer, and wherein the cathode does not overlap the first opening and the second opening.

10. The light-emitting device according to claim 9, wherein the conductive layer and the anode are spaced from each other.

11. The light-emitting device according to claim 9, wherein the cathode overlaps a gap between the conductive layer and the anode.

12. The light-emitting device according to claim 9, wherein the cathode comprises a region which does not overlap the layer containing a light-emitting material.

13. A light-emitting device comprising:

a first organic insulating layer over a first substrate;

a conductive layer over the first organic insulating layer;

an anode over the first organic insulating layer;

a second organic insulating layer over the conductive layer and the anode;

a layer containing a light-emitting material over the second organic insulating layer;

a cathode over the layer containing a light-emitting material;

a second substrate over the cathode; and a layer configured to keep a gap between the first substrate and the second substrate, wherein the conductive layer comprises a region overlapped by the cathode with the layer containing a light-emitting material and the second organic insulating layer therebetween, wherein the conductive layer comprises a region which is not overlapped by the second organic insulating layer, wherein a region of the conductive layer which is not overlapped by the cathode has a plurality of openings, and wherein each of the plurality of openings comprises a region which is not overlapped by the layer configured to keep the gap between the first substrate and the second substrate.

14. The light-emitting device according to claim 13, wherein the conductive layer and the anode are spaced from each other.

15. A light-emitting device comprising:

a first organic insulating layer over a first substrate;

a conductive layer over the first organic insulating layer;

an anode over the first organic insulating layer;

a second organic insulating layer over the conductive layer and the anode;

a layer containing a light-emitting material over the second organic insulating layer;

a cathode over the layer containing a light-emitting material;

a second substrate over the cathode; and a layer configured to keep a gap between the first substrate and the second substrate, wherein the conductive layer comprises a region overlapped by the cathode with the layer containing a light-emitting material and the second organic insulating layer therebetween, wherein the conductive layer comprises a region which is not overlapped by the second organic insulating layer, wherein the conductive layer comprises a plurality of openings including a first opening and a second opening, wherein each of the first opening and the second opening does not comprise a region overlapped by the cathode, and wherein each of the first opening and the second opening comprises a region which is not overlapped by the layer configured to keep the gap between the first substrate and the second substrate.

16. The light-emitting device according to claim 15, wherein the conductive layer and the anode are spaced from each other.

* * * * *